US009573802B2

(12) United States Patent
Wardle et al.

(10) Patent No.: US 9,573,802 B2
(45) Date of Patent: Feb. 21, 2017

(54) METHOD AND APPARATUS FOR BUILDING THREE-DIMENSIONAL MEMS ELEMENTS

(75) Inventors: Brian Lee Wardle, Lexington, MA (US); Fabio Ferruccio Fachin, Cambridge, MA (US); Stefan Nikles, Cambridge, MA (US); Mathew Varghese, Los Altos, CA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 13/397,174

(22) Filed: Feb. 15, 2012

(65) Prior Publication Data
US 2013/0207511 A1    Aug. 15, 2013

(51) Int. Cl.
*H01L 21/00*    (2006.01)
*B81C 1/00*    (2006.01)

(52) U.S. Cl.
CPC ......... *B81C 1/00007* (2013.01); *B81C 1/0019* (2013.01); *B81B 2203/0109* (2013.01); *Y10T 29/49002* (2015.01)

(58) Field of Classification Search
CPC .............. H01H 1/0036; H01H 59/0009; H01H 2001/0042; H01H 2061/006; H01H 2037/008; H01H 1/20; G01F 1/6845; G01F 1/688; G01F 1/684; B81B 2201/042; B81B 2203/0315; B81B 2203/0109; B81C 1/00007; B81C 1/0019; Y10T 29/49002
USPC .............................................. 257/415; 438/50
See application file for complete search history.

(56) References Cited

U.S. PATENT DOCUMENTS

| 6,812,820 | B1 | 11/2004 | Foullet |
| 7,253,709 | B1* | 8/2007 | Chang et al. ................... 335/78 |
| 7,508,294 | B2 | 3/2009 | Cabal et al. |
| 2004/0012062 | A1* | 1/2004 | Miyajima et al. ............ 257/419 |
| 2004/0252936 | A1* | 12/2004 | Despont et al. ................ 385/18 |
| 2006/0066640 | A1 | 3/2006 | Kothari et al. |
| 2006/0181379 | A1* | 8/2006 | Schwartz et al. ............... 335/78 |
| 2006/0268377 | A1 | 11/2006 | Haas et al. |
| 2008/0225370 | A1* | 9/2008 | Mansell ........................ 359/224 |
| 2009/0320274 | A1 | 12/2009 | Kato et al. |
| 2010/0188796 | A1 | 7/2010 | Bulovic et al. |
| 2013/0205895 | A1 | 8/2013 | Wardle et al. |
| 2013/0207511 | A1 | 8/2013 | Wardle et al. |

FOREIGN PATENT DOCUMENTS

| FR | 2 772 512 | 6/1999 |
| WO | 2013033032 | 3/2013 |

OTHER PUBLICATIONS

PCT Written Opinion of the International Searching Authority for PCT/US2012/052549.

(Continued)

*Primary Examiner* — Duy T Nguyen

(57) ABSTRACT

The disclosure generally relates to method and apparatus for forming three-dimensional MEMS. More specifically, the disclosure relates to a method of controlling out-of-plane buckling in microstructural devices so as to create microstructures with out-of-plane dimensions which are 1×, 5×, 10×, 100× or 500× the film's thickness or above the surface of the wafer. An exemplary device formed according to the disclosed principles, includes a three dimensional accelerometer having microbridges extending both above and below the wafer surface.

29 Claims, 22 Drawing Sheets

(56) References Cited

OTHER PUBLICATIONS

PCT International Search Report for PCT/US2012/052549.
International Search Report and Written Opinion issued to PCT Application PCT/US2013/032702 on Sep. 12, 2013.
Akiyama et al., "Scratch Drive Actuator with Mechanical Links for Self-Assembly of Three Dimensional MEMS," *Journal of Microelectromechanical Systems*, Mar. 1997, vol. 6, No., pp. 10-17.
Bahari et al., "Micromachined Three-axis Thermal Accelerometer with a Single Composite Heater," *Journal of Micromechanics and Microengineering*, 2011, vol. 21, 13 pages.
Fachin et al., "Mechanix of Out-of-Plane MEMS via Post-Buckling: Model-Experiment Demonstration Using CMOS," *Journal of Micromechanical Systems*, Nov. 15, 2011, 13 pages.
Johnstone et al., "Buckled Cantilevers for Out-of-Plane Platforms," *Journal of Micromechanics and Microengineering*, 2008, vol. 18, 7 pages.
International Search Report and Written Opinion issued PCT Application No. PCT/US2012/025281, dated Sep. 13, 2012.
Lim et al., "Design and Fabrication of a Novel Bimorph Microoptomechanical Sensor," *Journal of Micromechanical Systems*, Aug. 2005, vol. 14, No. 4, pp. 683-690.
Non Final Office Action issued Jan. 3, 2014 for U.S. Appl. No. 13/397,230.

\* cited by examiner

US 9,573,802 B2

METHOD AND APPARATUS FOR BUILDING THREE-DIMENSIONAL MEMS ELEMENTS

This application is filed on an even date with application Ser. No. 13/397,230 and application Ser. No. 13/397,318. The filing date benefit of priority is made to each application and the specification of each application is incorporated herein in its entirety.

BACKGROUND

Field of the Invention

The disclosure generally relates to method and apparatus for building a three-dimensional MEMS element with buckled elements. More particularly, the disclosure relates to methods and articles of manufactures that use a film's internal stresses to produce out-of-plane 3D microstructures.

Description of Related Art

The field of three-dimensional micro-electro-mechanical systems (3D MEMS) is still at its infancy. Despite efforts aimed at developing new MEMS manufacturing processes for creating 3D microstructures, conventional fabrication techniques (e.g., surface and bulk micro-machining, CMOS) are still largely two dimensional. The features produced by these techniques are defined predominantly on the wafer plane with very limited possibility of creating functional elements that extend in the out-of-wafer-plane dimension.

Consequently, most MEMS devices are still comprised of planar, 2D elements and are therefore intrinsically limited in their ability to provide three-dimensional functionalities such as sensing and actuation. This has resulted in highly tailored solutions where multiple MEMS units with different detection modes and sensitivity are combined to allow multi-axial functionalities. Aside from increasing manufacturing cost, the approach has increased device complexity.

In an effort to overcome these limitations, some fabrication techniques have been recently developed that provide non-trivial heights in MEMS. For example, deep reactive ion etching (DRIE) is a technology that enables creating very high aspect-ratio elements (i.e., wafer-scale). DRIE has been widely adopted over the past decade. However, DRIE does not yield fully three-dimensional elements, as it does not make curved surfaces. Instead, DRIE results in quasi 3D elements that are created by etching (i.e., projecting) 2D geometries into a substrate. Additional approaches to high aspect ratio microstructures include LIGA and gray scale lithography. These techniques present similar limitations to DRIE and are typically more costly than DRIE.

To date, polymer MEMS is the only field where fully 3D elements have been realized. Microstereolithography of thick polymeric layers (e.g., SU-8 photoresist) has attracted particular attention, in which several groups have demonstrated complex geometries such as micro-turbines, microgear and helicoid cogs. In addition to microstereolithography, interference lithography allows rapid fabrication of large-area, periodic 3D templates on sub-micrometer polymeric substrates, with accurate control of both element symmetry and volume fraction. However, even these approaches are not suited for applications where high strength and limited structural deformability are required (e.g., actuators and shock sensors). This is due to the fact that polymers are typically characterized by very low Young's moduli (e.g., $E_{SU8} \sim 3$-$4$ GPa while $E_{Silicon} \sim 130$ GPa).

High temperature applications are also incompatible with polymer technologies. The practicality of polymer-based 3D MEMS is therefore limited and dependent on the selected application, hence requiring alternative processes to create fully three-dimensional MEMS element using material such as silicon and metals.

Therefore, there is a need for a method and system for developing an on-chip 3D polymer MEMS that overcome the above-described shortcomings.

SUMMARY

Disclosed herein are methods and processes for manufacturing out-of-plane 3D MEMS. The produced devices have large out-of-plane features that are advantageous for controlled placement above and below the wafer/film plane. In certain exemplary embodiments, devices provide 1×, 5×, 10×, 50×, 100× or 500× out-of-plane projection with respect to the film's thickness. Importantly, the features are built on-chip in parallel, as opposed to using sequential off-chip manipulation of the elements or on-chip devices to move the elements. As used herein the term out-of-plane or out-of-wafer-plane are used interchangeably and denote a MEMS structure in which an element has a significant deflection out of the wafer plane. Also, as used herein the term on-chip generally refers to an element of a MEMS structure which is formed during the manufacturing of the wafer and not as an after-the-fact addition (i.e., off-chip). The processes (and the resulting apparatus) disclosed herein are on-chip processes in that the deformation is caused directly on the chip during the manufacturing process. It should also be noted that a micro-bridge (interchangeable, beam) can buckle without arching. Inducing gradient stress can arch the beam while applying mean compressive stress above the critical buckling load of the beam will cause buckling.

In one embodiment, the disclosure relates to a method for causing post-release deformation in a microbridge formed by a CMOS process. The microbridge is used as an exemplary representation and it may be replaced with a single- or multi-layer film, one or more beams or microbridges, a plate or a membrane/diaphragm. The method includes the steps of identifying a film material to be formed as microbridge extending between a first support and a second support; forming a first control element (or Patch) on the first support and a second control element on the second support; forming a microbridge (or a beam, a film or a diaphragm) extending from the first support to the second support, wherein the microbridge overlaps a portion of at least one of the first control element or the second control element and wherein at least one of the first control element or the second control element exerts an external moment to the microbridge. The film can comprise a single layer of material or multiple layers of material.

In another embodiment, the disclosure relates to a method for causing post-release deformation in a microbridge formed by a CMOS process, the method comprising the steps of: identifying a film material to be formed as microbridge extending between a first support and a second support; forming the microbridge between the first support and the second support over a substrate; forming a first post (interchangeably, step) over the first support, the first post extending above a second surface of the microbridge; forming a second post over the second support, the second post extending above the second surface of the microbridge; and removing the substrate. In an application of this embodiment, the first post abuts the first edge of the microbridge and the second post abuts the second edge of the microbridge.

In another embodiment, the disclosure relates to A method for causing post-release deformation in a microbridge formed by a CMOS process, the method comprising: forming a runner (or a bridge) between the first support and a second support, the runner constrained by a runner support element; forming a microbridge over a microbridge support element, the microbridge spanning between the first support and the second support; forming a plurality of bridges connecting the runner to the microbridge; removing the runner control element from the runner to release the runner; removing the microbridge control element from the microbridge to release the microbridge; and removing the runner.

A microbridge can arch due to simple applied gradient stresses. On the other hand, buckling requires compressive mean stress above a certain threshold. In an exemplary embodiment, the disclosure relates to a method for causing post-release deformation in a microbridge formed by a CMOS process. The post-release deformation can be characterized as arching or buckling of the microbridge. The exemplary method includes the steps of: forming a microbridge between a first support and a second support, the microbridge constrained by a microbridge support element; removing the microbridge support element to allow an out-of-plane arching or buckling of the microbridge; identifying a first point of maximum slope on the microbridge arch (or buckling); and attaching a tether to the first point of maximum slope. The tether forms an out of plane extension with respect to the microbridge arch. A relationship is generally not required between the gradient in the tether and the microbridge. The gradient in the microbridge sets the bucking direction for the microbridge. The gradient in the tether sets the direction in which the tether will bend and therefore extend out of plane.

In yet another embodiment, the disclosure relates to a method for forming an out-of-plane MEMS structure. The method comprises (i) forming a film on a substrate, the film articulating a microbridge supported by a first portion of the substrate when a second portion of the substrate is removed; (ii) forming a causing element on the substrate; (iii) coupling the causing element to the microbridge to communicate at least one of a residual mean stress or a residual gradient stress therebetween; and (iv) removing the second portion of the substrate to allow the causing element to bias an out-of-plane deformation of the microbridge.

In another embodiment, the disclosure relates to a method for forming a three-dimensional microstructure. The microstructure can be a MEMS device. The method includes the steps of: (i) forming a first film on a substrate, the film articulating a microbridge supported by a first portion of the substrate when a second portion of the substrate is removed; (ii) forming a first causing element on the substrate; (iii) forming a second causing element on the substrate; (iv) coupling the first and the second causing elements to the microbridge to communicate at least one of a residual mean stress or a residual gradient stress to the microbridge; and (v) removing the second portion of the substrate to allow the causing elements to from an out-of-plane geometry from the microbridge.

In still another embodiment, the disclosure relates to a MEMS microstructure having an element that protrudes from the surface of wafer. The microstructure comprises: a substrate supporting a microbridge, the microbridge extending over the cavity in the substrate; a biasing element in communication with the microbridge, the biasing element having an internal mean stress and a gradient stress; and a connection for communicating at least one of the mean stress or the gradient stress from the biasing element to the microbridge; wherein the bias forces a large deformation (e.g., an out-of-plane protrusion) of the microstructure beyond a surface of the substrate.

In another element the disclosure relates to a thermosensitive accelerometer, comprising: a substrate defining a first support and a second support; a first microbridge spanning between the first support and the second support, the first microbridge forming an out-of-plane surface with respect to a surface of the substrate, the first microbridge having a first X-Y thermopile; a second microbridge spanning between the first support and the second support, the second microbridge forming an out-of-plane surface with respect to the surface of the microbridge, the second microbridge having a second X-Y thermopile; a heater positioned at the substrate level; a first tether coupled to the first microbridge and a second tether coupled to the second microbridge, each of the first and the second tethers is respectively coupled to a third and a forth thermopile; wherein at least one of the third or the forth thermopile forms a plane perpendicular to one of the first or the second thermopile, and wherein the first microbridge defines an out-of-plane surface that is 10× the microbridge's thickness.

BRIEF DESCRIPTION OF THE DRAWINGS

These and other embodiments of the disclosure will be discussed with reference to the following exemplary and non-limiting illustrations, in which like elements are numbered similarly, and where.

DETAILED DESCRIPTION

In the embodiments disclosed herein thin-film characterization and microfabrication techniques are combined to produce on-chip three dimensional designs and features. In one embodiment of the disclosure, residual stress control and buckling is characterized and exploited to induce controllable, large out-of-plane deformations of MEMS elements. To this end, both mean and gradient residual stresses are gainfully used to induce large out-of-plane deflections in microstructures while preserving the feature's functionality. Additional methods are provided according the disclosed embodiments which enable controlling the out-of-plane deflections in order to form useful and functional 3D MEMS features in microstructures.

Characterization of thin-film layered material is critical to the development of many MEMS devices. Residual stresses form during production and determine both the final shape and the performance of micro devices. Residual stresses become particularly important and pronounced after the substrate has been removed (i.e., the release state). After release, the film becomes unconstrained and it evolves to relieve, cancel or minimize the residual stress through mechanical deformation of the thin element.

Figure 1A:
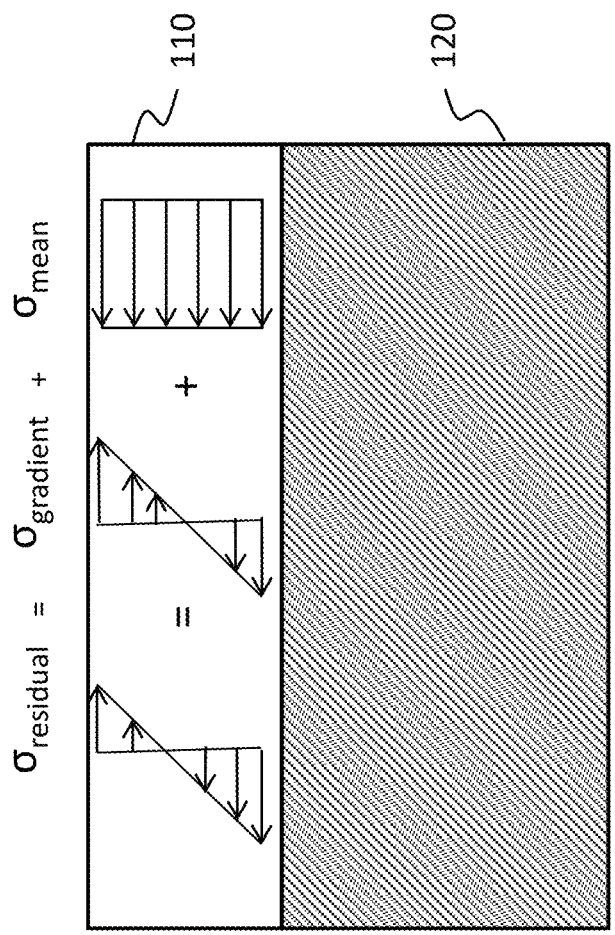
FIG. 1A schematically shows the residual stresses present in a conventional thin film.

FIG. 1A schematically shows the residual stresses present in a conventional thin film material. FIG. 1 is an exemplary representation and is simplified for illustrative purposes. Specifically, FIG. 1A shows thin film 110 formed over substrate 120. Thin film 110 may comprise a single layer of material or it a multi-layered material. Residual stresses ($\sigma_{residual}$) arising from lattice mismatch and other physical and thermal limitations are represented as a combination of compressive (negative) mean stress ($\sigma_{mean}$) and positive gradients ($\sigma_{gradient}$).

$$\sigma_{residual} = \sigma_{mean} + \sigma_{gradient} \quad (1)$$

Figure 1B:
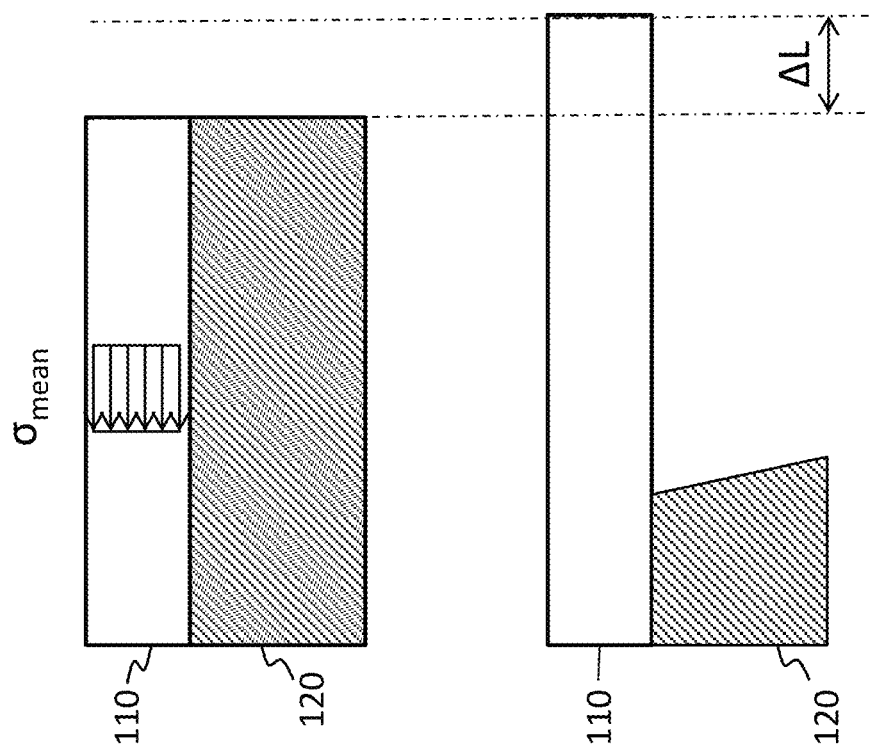
FIG. 1B schematically shows the effect of mean stress when the substrate is released.
Figure 1C:
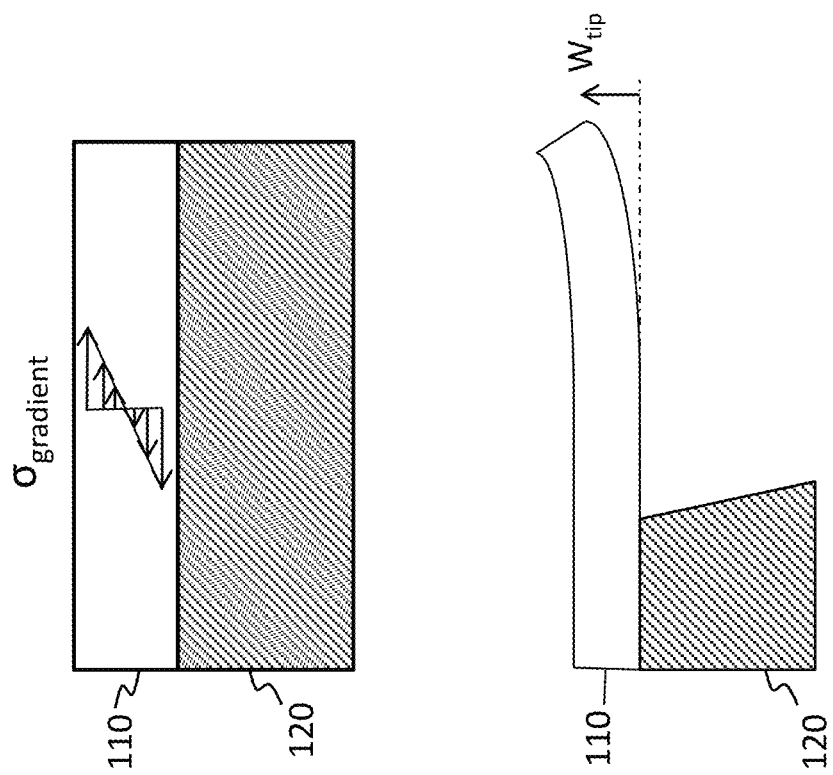
FIG. 1C schematically shows the effect gradient stress when the substrate is released.

FIGS. 1B and 1C schematically show the effect of each of mean and gradient stresses independently when substrate 120 is removed. In FIG. 1B, the film is characterized by compressive mean stress and will undergo elongation ($\Delta L$) at release. Similarly, FIG. 1C shows the effect of a positive gradient which causes the film to turn or bend upward ($w_{tip}$). The direct effects of mean and gradient stress on the free a standing element (a microbridge) are therefore significantly different. While the mean stress causes in-plane deformation, gradient stress causes out-of-plane deformation of the structural feature.

In one embodiment of the disclosure residual stresses are used to achieve out-of-plane deformation significantly larger than those produced by gradient effect through the exploitation of the buckling effect. Conventionally, the term buckling indicates a structural instability that elements such as bridges and membranes undergo when subject to compressive loads which exceed a critical level. Thus, when a critical buckling load is applied, the resulting deformation associated with the failure is very large.

Figure 2:
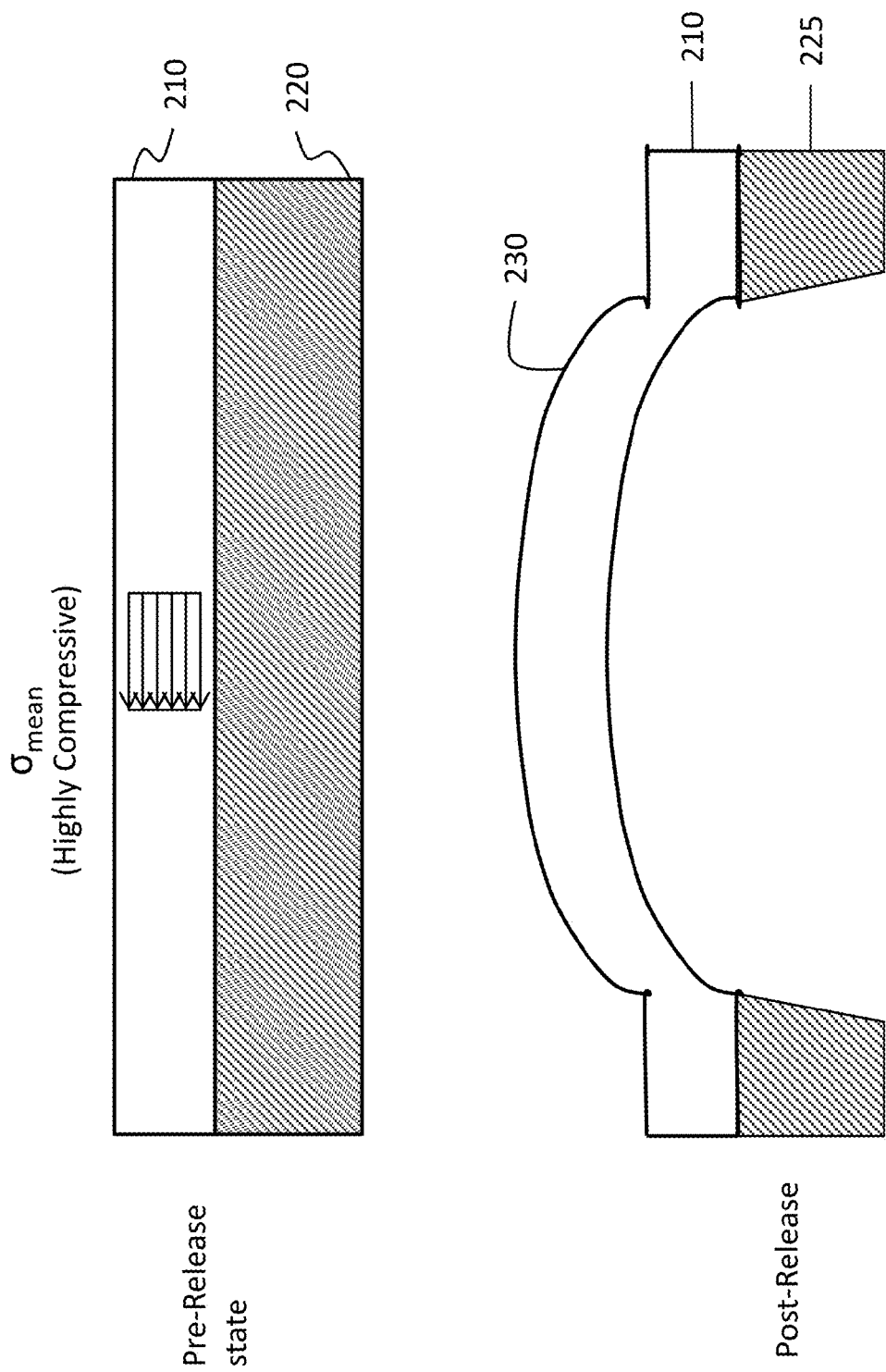
FIG. 2 schematically shows buckling of a microbridge under compressive mean stress.

FIG. 2 schematically shows buckling of a microbridge under compressive mean stress. In the pre-release state of FIG. 2, substrate constrains film 210 in rigid contact with substrate 220. The residual mean stresses are contained within film 210 even though the critical stress state may be reached or exceeded. Once the constraint of substrate 220 is removed (i.e., the post-release state with supports 225), film 210 undergoes buckling 230 and its configuration transitions from planar to an out-of-plane configuration. Any increase in applied load beyond the critical load causes significant non-linear deformation in the element, as well as significant out-of-pane bending.

The presence of this highly non-linear load deformation region in the response to elements subjected to compressive load allows large out-of-plane and 3D MEMS elements according to one embodiment of the disclosure. Thus, according to the principles disclosed herein, large 3D and out-of-plane elements can be constructed by identifying, characterizing and controlling the compressive mean residual stresses in the film element.

According to another embodiment of the disclosure, thin film material can be deposited on a substrate and its residual stress can be manipulated and controlled to yield a high compressive stress in the film. The microstructure is then released to create the desired structural element that would buckle under the weight of its compressive mean stress, thus yielding a functional element located well above the wafer plane.

Figure 3A:
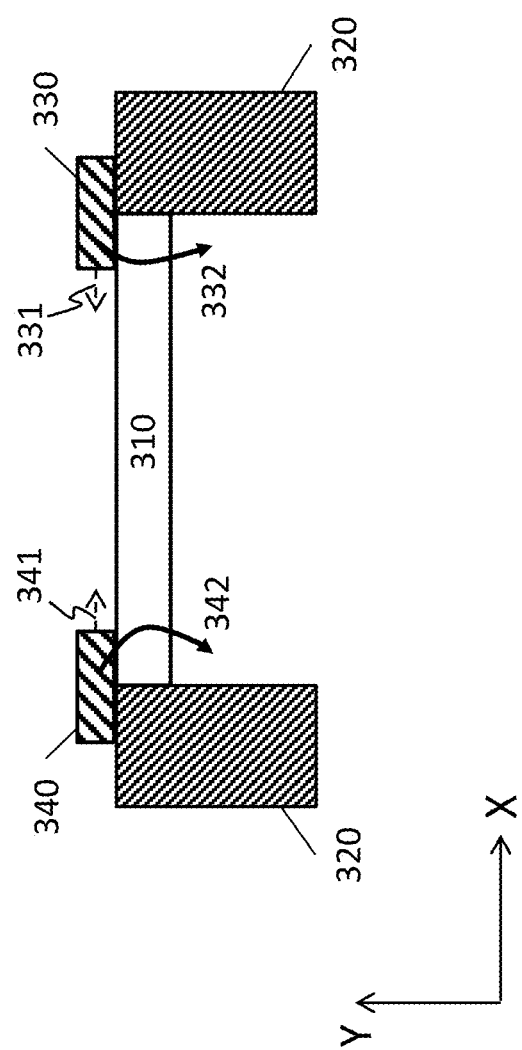
FIG. 3A schematically shows the patches architecture for causing an out-of-plane element.

FIG. 3A schematically shows the patches (flanges) architecture for controlling and defining an out-of-plane element. Namely, the architecture shown in FIG. 3A uses patches (flanges) of thin-film material that are strategically placed either on top or the bottom surface of the element to be controlled. In one embodiment of the disclosure, one or more patch is positioned near the root of the microbridge element. The patches can be selected from material having known residual stress and can be tailored to apply an external moment that forces the controlled element to deform in the desired direction. The desired direction can be opposite to what its intrinsic stress state would dictate.

In FIG. 3A, support elements 320 support microbridge 310. Support elements 320 can be formed from conventional MEMS material and may initially define a continues substrate for supporting film 310 (see, for example, substrate 220 in FIG. 2). Film 310 can comprise a single layer material or a composite of several film layers. Film 310 bridges the gap between support elements 320 and contains internal residual mean stresses that would force it to buckle away from the support element. Thus, the natural tendency of microstructure's buckling would be along the Y-axis.

Materials of both large mean and large gradient residual stresses can be used in building patches 330 and 340. Large mean stress yields significant control torques while large gradients manipulates the local curvature of the controlled element. This is illustrates by arrows 332 and 342 in FIG. 3A, where compressive patches 330 and 340 cause downward deflection of microbridge 310 with positive gradient stresses. Patches with large tensile mean stress (or highly-compressive) can be used to cause upward deflection of structural elements characterized by negative gradients (see arrows 331 and 341). On the other hand, if 341 is reversed with a tensile stress in patch 340, opposite signs on 342 and 332 will result. In other words, the force wood act upward on film 310.

Patches 330 and 340 may be used individually or collectively to manipulate the micro-bridge's post release deformation. In a preferred embodiment, the patches 330 and 340 overlap support elements 320 and microstructure 310. Conventional techniques can be used to form patches 330 and 340 on the element. The size, thickness and geometry of the patch can be used to increase, decrease or tailor the causing force. It should be noted that while the schematic representation of FIG. 3A illustrates the principles in a 2D rendering, the concept is equally applicable to 3D elements and the patches can be formed in more than two locations to manipulate and control the residual stresses of film 310 and thereby form the desired out-of-plane element.

Figure 3B:
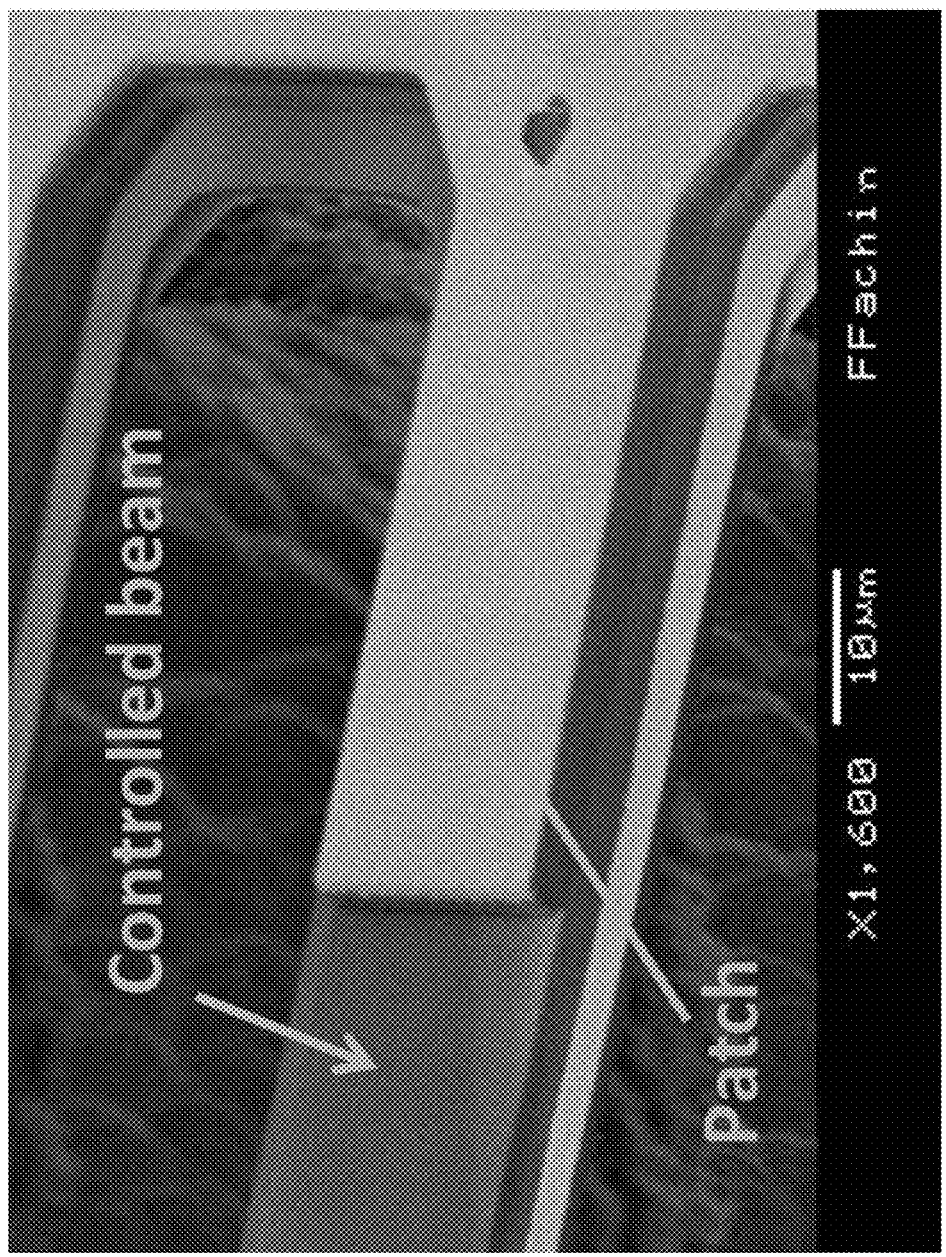
FIG. 3B is an image of a scanning electron microscopy showing a MEMS structure with a patch covering a portion of a controlled beam.

FIG. 3B is a scanning electron microscopy showing a MEMS structure with a patch covering a portion of a controlled beam. Specifically, FIG. 3B shows an exemplary embodiment of the disclosure in which a patch is extended over the control beam to affect the stresses working on the control beam. It should be noted that the bean shown in FIG. 3B can be, among others, a layer of film or multiple layers of film without departing from the disclosed principles.

The patch architecture is flexible in that it allows easy control of the applied moment by selecting a different material for the patches or by tailoring the patches geometry (thickness, length) but it may be limited in that the final element is not identical to the original element. For applications where the presence of a patch is unacceptable, an additional post-release etch step can be implemented. The post-release etch can solely etch the patches. Alternatively, a higher etch selective material can be used for the patches such that they could be removed during the release step by extending the duration of the etching sequence.

Figure 4A:
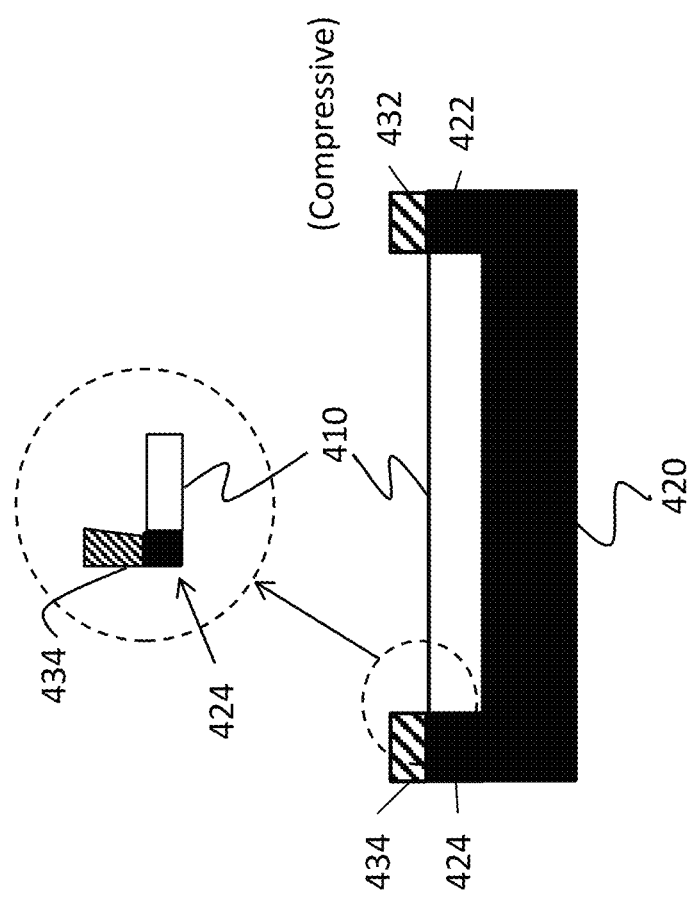
FIG. 4A schematically shows the step-up architecture for causing an out-of-plane element.
Figure 4B:
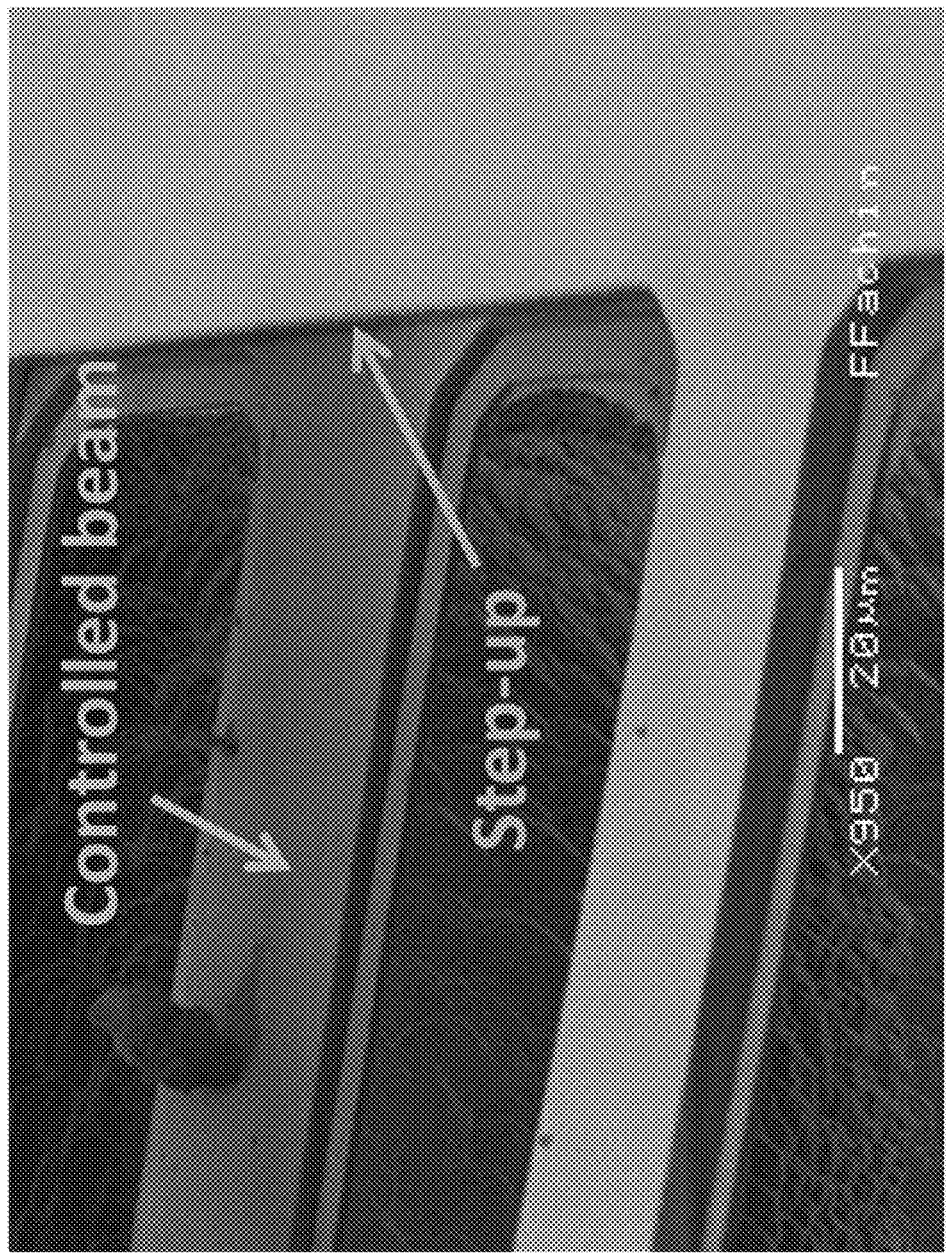
FIG. 4B is an image of an scanning electron microscopy showing a MEMS structure with the step-up architecture.

FIG. 4A schematically shows the step-up architecture for forming an out-of-plane element. Specifically, FIG. 4B shows a compressive bias brought by causing both a downward moment and a non-zero slope at the beam's post. In FIG. 4B, film 410 is formed over substrate 420 between supports 422 and 424. Steps 432 and 434 are formed over supports 422 and 424, respectively. Unlike the patch portions of FIG. 3A, steps 432 and 434 do not overlap film 410. The steps maybe bordered with the film. The control layer is located at (and aligned with) the very extremity or distal end of the controlled element, thus causing the element's deformation by inducing a non-zero slope at the root. Compressive/tensile films can therefore be used as step up materials to induce downward/upward deflection of elements with positive/negative gradients. Compared to patches shown in FIG. 3A, the step up architecture is advantageous in that it does not affect the geometry of the controlled element. The exploded view of FIG. 4A shows an embodiment of the step where the vertical sides are asymmetric. A disadvantage of the step architecture it may be limited in its ability to tailor the biasing force.

FIG. 4B is an image of an scanning electron microscopy showing a MEMS structure with the step-up architecture. It can be seen from FIG. 4B that the step-up surrounds the controlled beam. As seen, the step up is at the root of the beam.

Figure 5:
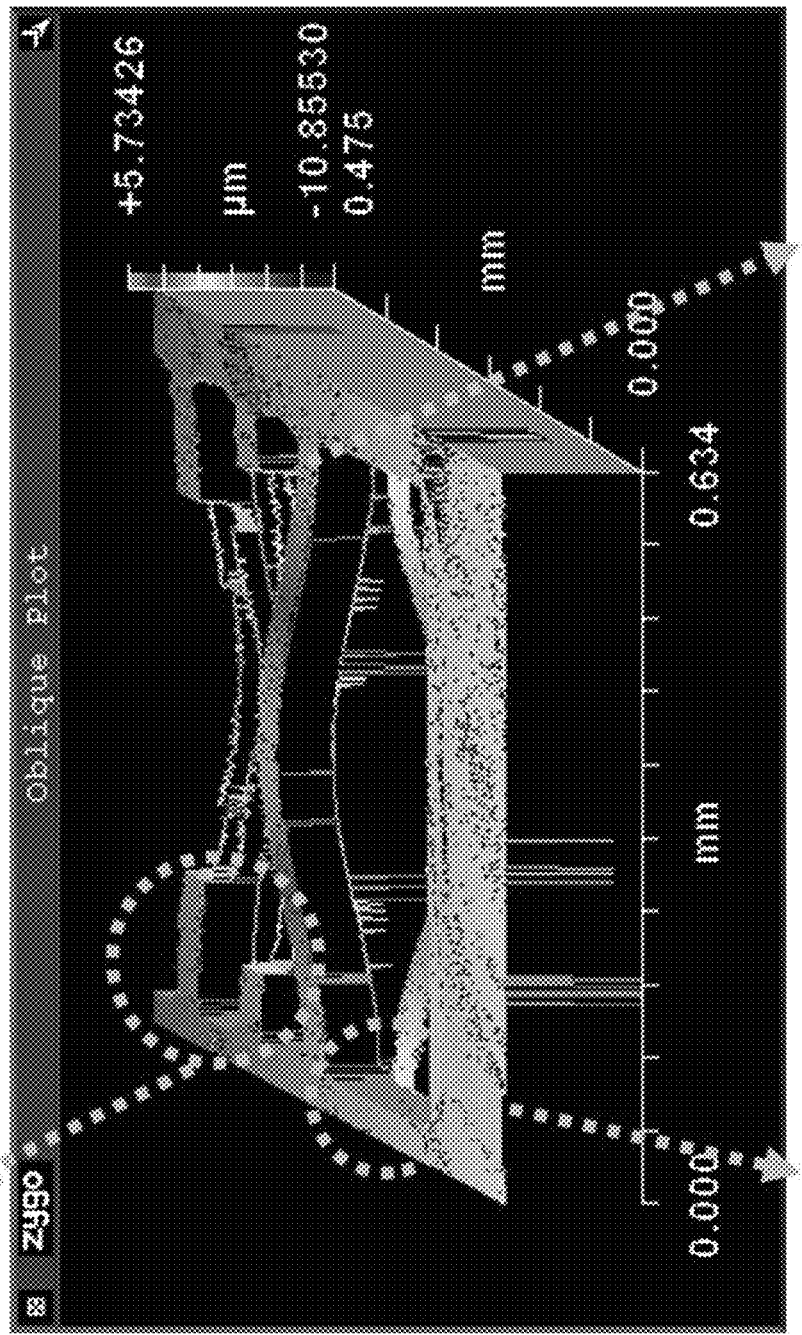
FIG. 5 shows an oblique profilometery plot exhibiting the application of patches and steps architectures to a MEMS element.

FIG. 5 shows an oblique profilometery plot exhibiting the application of patches and steps architectures to a MEMS element. Specifically, FIG. 5 shows the experimental example of patches applied to the control of a dielectric bilayer/ILD/oxide micro-bridge, where a 2 μm-thick oxide patch ($\sigma_{mean}$~−91.5 MPa, $\sigma_{grad}$=42.1, K=0.92 (where K is boundary stiffness)) was used to introduce downward deflection of the element. FIG. 5 also demonstrates the buckled-up/buckled-down device architecture where an array of beams are that alternatingly extend (i.e., buckled) above and below the wafer plane are exploited to controllably position sensing elements at different Z levels, thus representing an on-chip technique to 3D MEMS that does not require any post-release step.

Figure 6A:
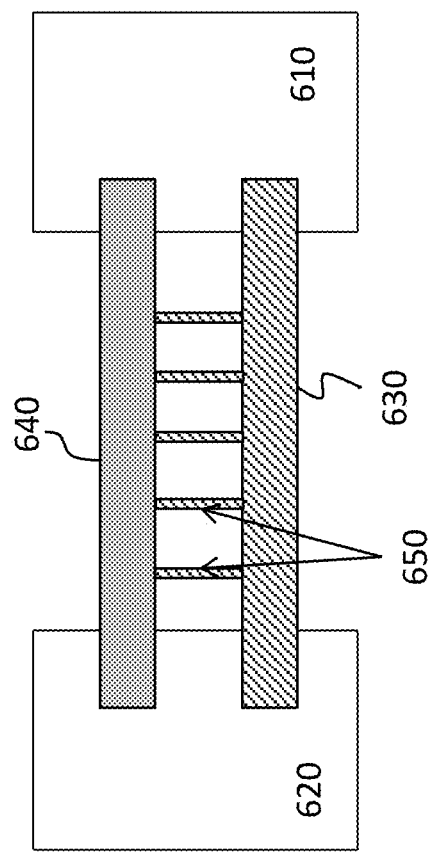
FIG. 6A schematically shows the runner architecture for causing an out-of-plane element.
Figure 6A:
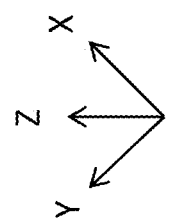

FIG. 6A schematically shows the runner architecture for causing an out-of-plane element. The architecture of FIG. 6A uses a an external support element to connect and controllably deform the controlled element to the desired shape. The deformation direction and magnitude is driven by the residual stress in the support element. Referring to FIG. 6A, control beam (micro-bridge) 650 is spanned between first supports 610 and second support 620. The microbridge (controlled beam) can be optionally formed as a film (or multiple layers of films) over a substrate (not shown). Runner 630 (an external support) is also formed parallel to the microbridge and is connected thereto via connecting bridges 650.

Runner 630 is characterized by both a large compressive mean stress and a gradient stress opposite in sign to that of controlled element 640. In one embodiment, the compressive mean stress of runner 630 is large enough to cause buckling. By designing the etching sequence such that runner 630 is released prior to controlled element 640, the post-release deformation of the controlled element can be biased independent of its gradient stresses. Pursuant to this application, runner 630 is free to deform while controlled element 640 is fully constrained. As with patches and step-up architecture, the material and the physical geometry of the runner can be selected to provide the desired buckling in microbridge 640.

Figure 6B:
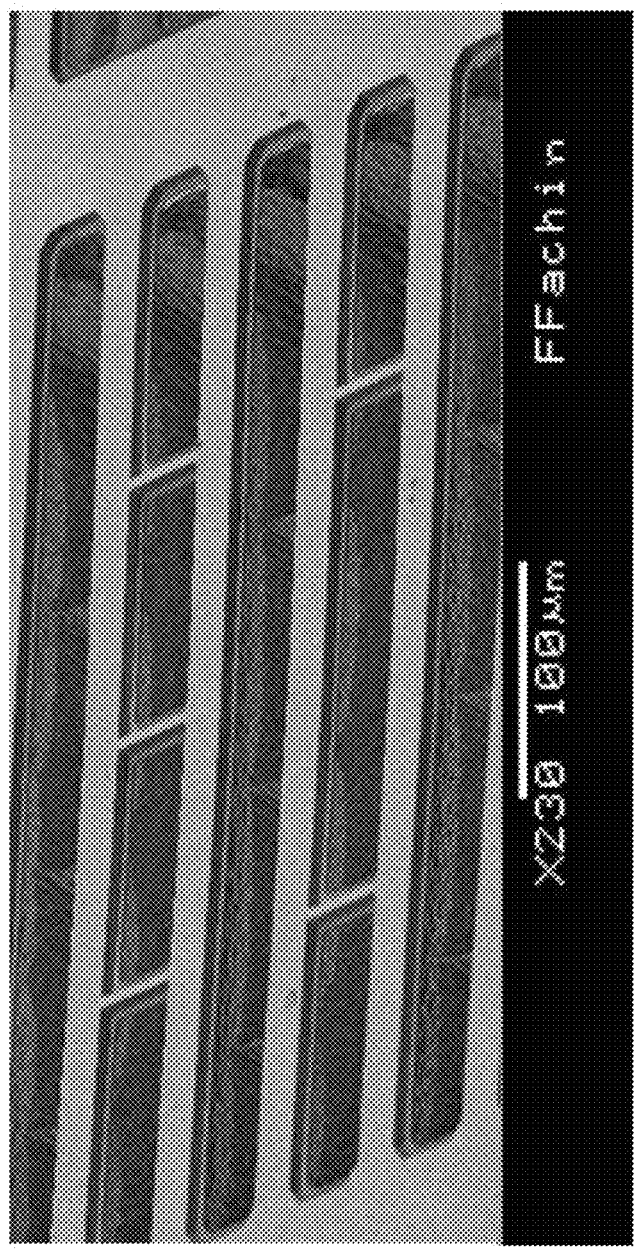
FIG. 6B is a scanning electron micrograph showing the post-release configuration for an exemplary runners architecture.

In one embodiment, once the controlled element has been released, connecting bridges 650 may be optionally removed. FIG. 6B is a scanning electron micrograph showing the post-release configuration for an exemplary runners architecture. The runner architecture can be exploited to cause buckling in micro-bridges whose mean stress would otherwise not suffice to induce buckling. The critical buckling load for a shallow arch is lower than that of a perfectly flat column having the same geometrical/material properties. The out-of-plane deflections that the runner induces on the controlled microbridge (effectively making it a shallow arch) may suffice to lower the critical bucking load below the mean residual stress level of the element resulting buckling of the micro-bridge. In one implementation of the runner architecture 2-3 connecting bridges 650 were used based on the results of finite element (FE) analysis which showed that the runner's post-release deformation can be maximized as the number of connecting elements decreased.

Figure 7A:
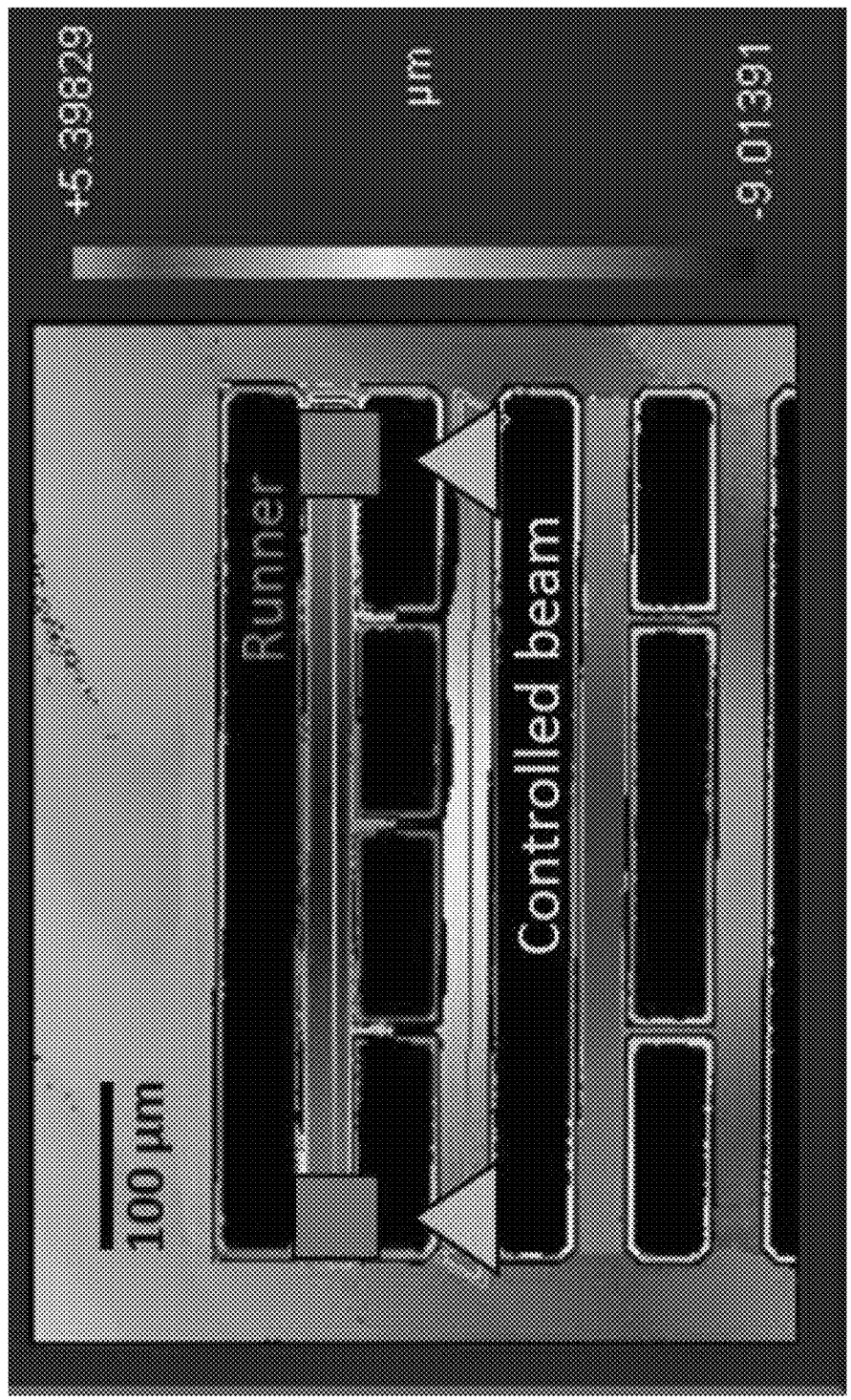
FIG. 7A is the profilometry image exhibiting successful manipulation of microbridge buckling using two distinct runner architectures.
Figure 7B:
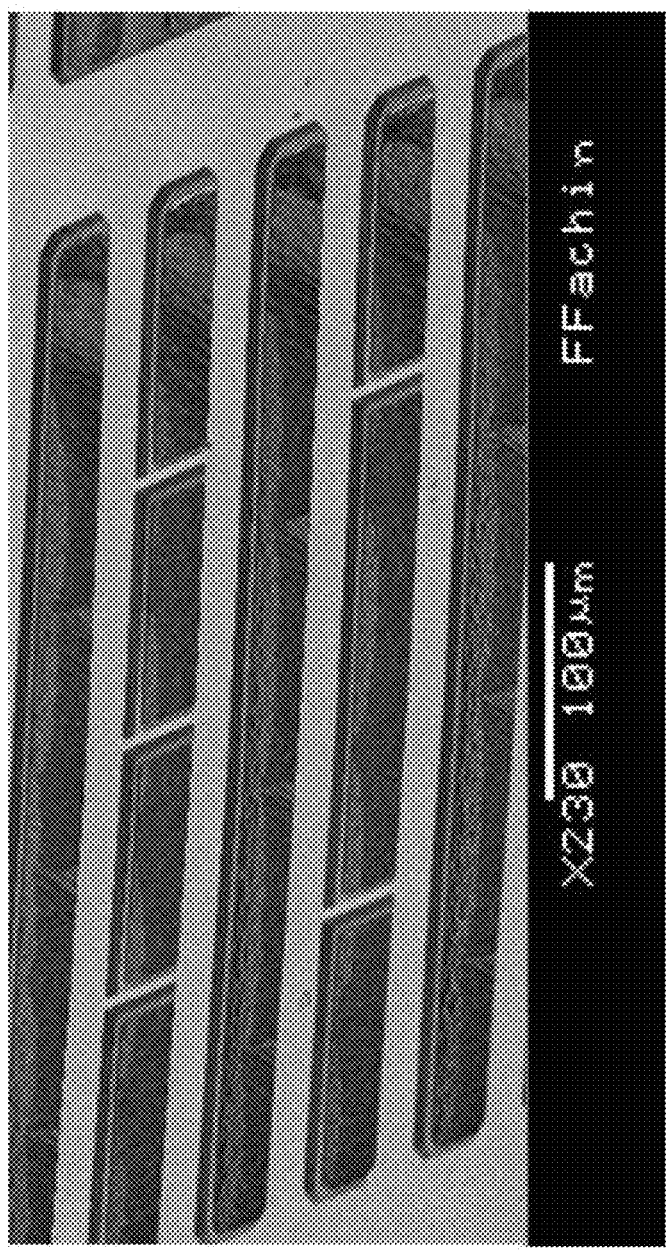
FIG. 7B is a scanning electron micrograph showing the post-release configuration for the runners architectures presented above.

FIG. 7A shows the experimental profilometry image exhibiting successful manipulation of microbridges buckling using two distinct runner architectures. FIG. 7B is a scanning electron micrograph showing the post-release configuration for the runners architectures presented above. Specifically, FIGS. 7A and 7B present the results relative to the application of the runner architecture (3.3 μm-thick Al/Oxide/Dielectric bilayer multilayer; $\sigma_{mean}$=−50.6 MPa; $\sigma_{mean}$=−24.5 MPa) to the control of a dielectric bilayer/ILD/Oxide microbridge, where the runner forces the controlled microbridge to deflect downwards despite the positive gradient stress inside the structure. Either two or three connecting bridges are used to connect the runner and the controlled element and the same Al/Oxide/Dielectric bilayer was used for the connecting bridges as well. The results exhibit that manipulation of microbridge buckling is successfully achieved independent of the number of connecting bridges, although larger deflections are noticeable in the controlled element where three connecting bridges are utilized.

The following considerations should be made regarding the application of runners to non-planar MEMS design.

First, depending on the application, once the controlled structure has been fully released, the connecting bridge elements and/or the runner can be either left in place or removed. For example, with reference to the buckled-up/buckled-down architecture, post-release removal of runners could allow creation of microbridge elements characterized by identical material composition (i.e., identical residual stresses) yet existing in two opposite equilibrium states (one buckled upwards, one buckled downwards), without the need for any post fabrication step (e.g., probe tip induced deformation). If runner/bridge removal is required, these elements could, for example, be designed and fabricated using higher etch-selectivity materials such that they could be removed during the release step by extending the duration of the etching sequence.

Second, the runner architecture can be exploited to cause buckling in microbridges whose mean stress would otherwise not suffice to induce buckling. The critical buckling load for a shallow arch is in fact lower than that for a perfectly flat column having the same geometrical/material properties. The out-of-plane deflections that the runner induces on the controlled microbridge (thus effectively making it a shallow arch) may therefore suffice to lower the critical buckling load below the mean residual stress level of the structure, hence resulting in buckling of the microbridge.

Figure 8:
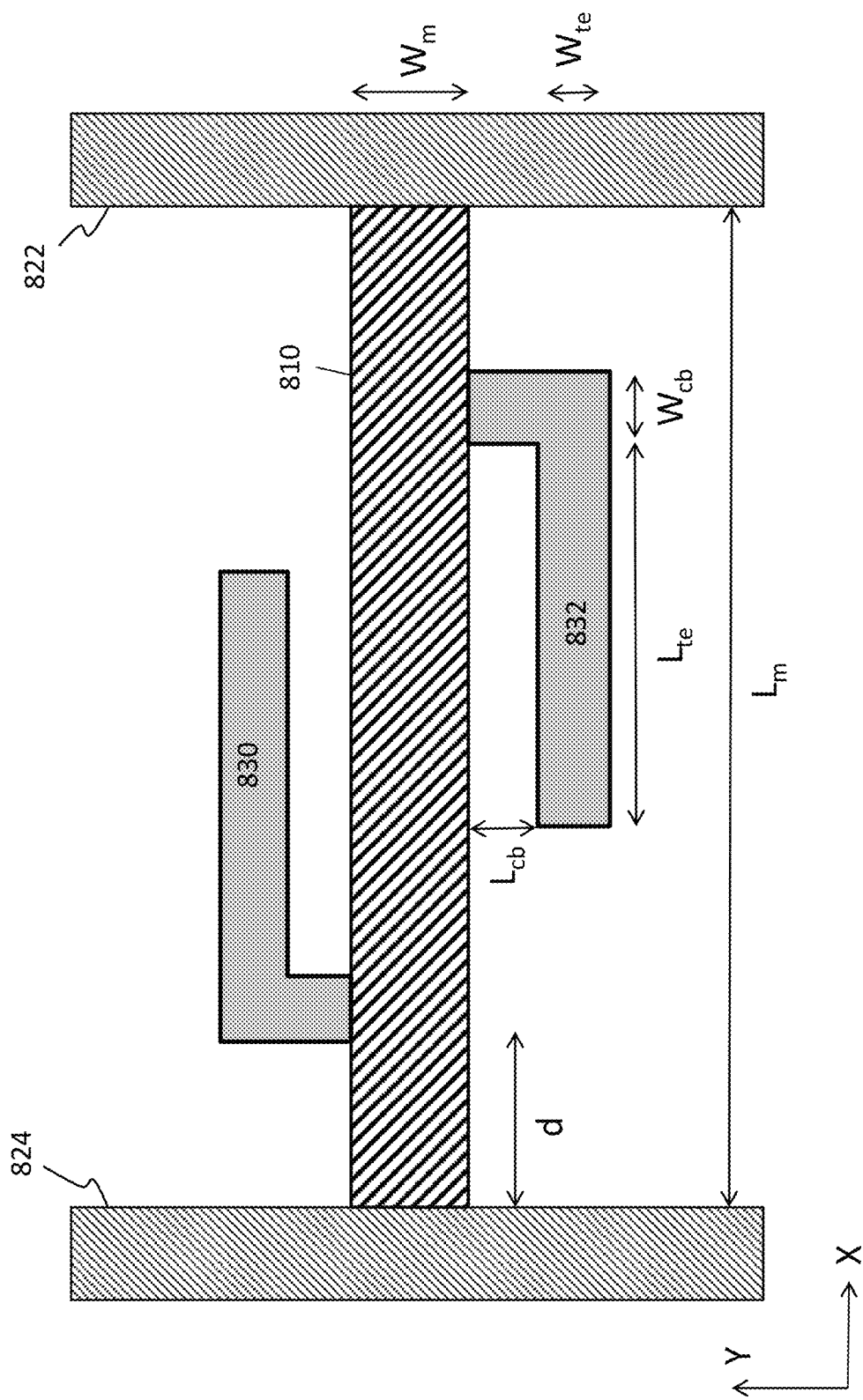
FIG. 8 schematically shows the tethered architecture for adding out-of-plane height to a MEMS element.

FIG. 8 schematically shows the tethered architecture for adding out-of-plane height to a MEMS element. In this embodiment, slender cantilever members are added to the microbridge so as to protrude from the sides of a buckled microbridge. Specifically, FIG. 8 illustrates microbridge 810 and tethers 830 and 832. The microbridge is suspended between first support 822 and second support 824. The geometrical parameters are also represented on FIG. 8 as $L_m$, $W_m$, $L_{te}$, $W_{te}$, $W_{cb}$ and $L_{cb}$. These parameter are discussed in greater detail below in reference to FIGS. 9-13.

The placement of the tethered member along the microbridge's length and its material composition are important factors in producing the desired out-of-plane element. In one implementation of the disclosure, the device height is maximized by attaching the member to the point of maximum slope along the buckled microbridge. In another implementation, the member is made of a layered material with large gradient stress, such that additional height can be gained by exploiting the tethers' gradient-induced bending. The tether's bending direction should be compatible with the direction in which the microbridge buckles.

The principles disclosed herein can be used to build highly sensitive MEMS devices that can be used, among others, as sensors (load sensors and flow sensors) or accelerometers. In the publication entitled "Micromachined three-axis thermal accelerometer with a single composite heater," (J. Bahari and A. M. Leung, *Journal of Micromechanics and Microengineering*, vol. 21, no. 7, p. 075025, 2011), the authors demonstrated a single heater, three-axis, thermal accelerometer based on buckled cantilevers. In their design, out-of-plane height is created through a post-fabrication step where a probe tip is used to induce buckling in pre-released cantilevers, which are eventually placed against stoppers (anchored to the substrate) to preserve the buckled configuration after the probe force is removed. (See also, R. W. Johnstone, A. H. Ma, D. Sameoto, M. Parameswaran, and A. M. Leung, "Buckled cantilevers for out-of-plane platforms," *Journal of Micromechanics and Microengineering*, vol. 18, no. 4, p. 045024, 2008). Applying the design principles disclosed herein, a 3D architecture was fabricated with functionalities parallel to those of Bahari and Leung, while providing significant advantages in terms of device fabrication (fully integrated process, with no post-release steps required), accurate sensor placement and flexibility in device spatial definition (e.g., allowing creation of 3D elements that extend both above and below the wafer plane).

Figure 9B:
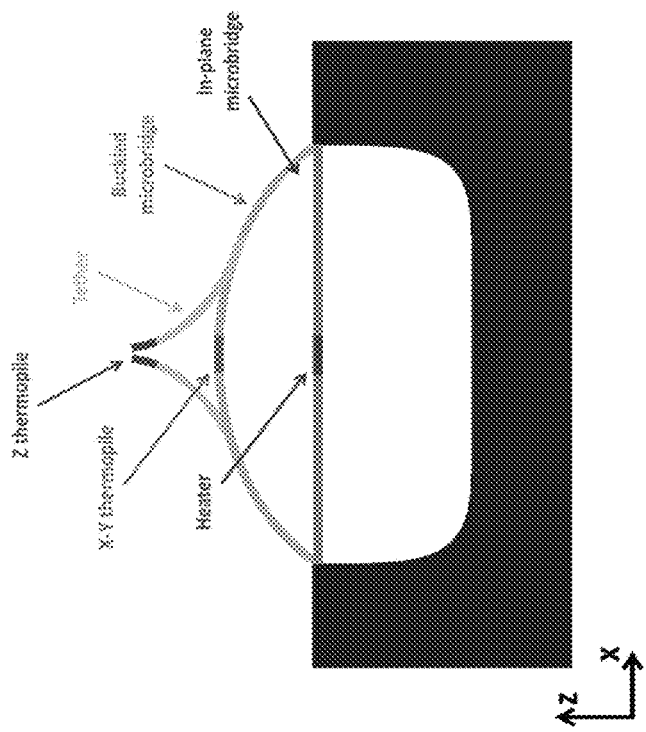
FIGS. 9A and 9B are schematic representations of three-axis thermal accelerometer.
Figure 9A:
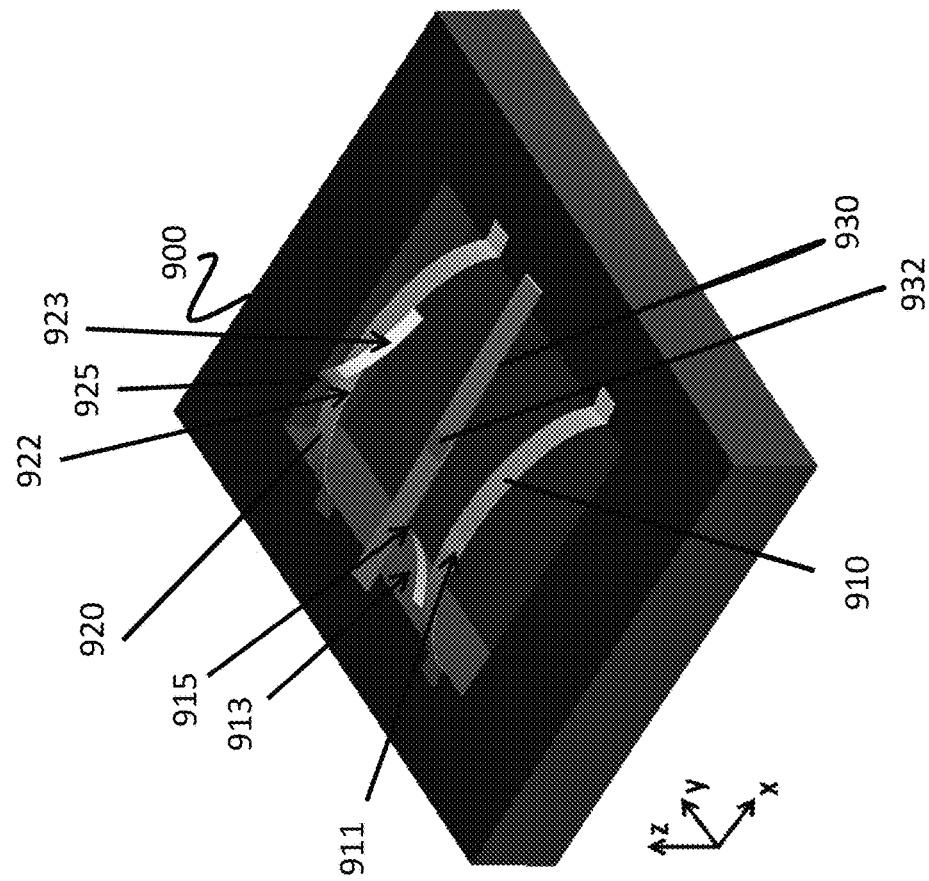

FIGS. 9A and 9B are schematic representations of a three-axis thermal accelerometer according to an embodiment of the disclosure. Multi-axis (i.e., two- or three-axis), single heater thermal accelerometer technology requires the ability to fabricate functional elements (specifically, thermopiles) that extend out of the wafer plane. In the embodiment of FIG. 9, buckled microbridge and tether architecture was fabricated for thermal accelerometers that combined microbridge buckling and residual-stress control to enable multi-axis thermal accelerometers using a single heater. The accelerometer of FIG. 9 is formed on support substrate 900 and includes a non-buckled (in-plane) microbridge 930, with heater 932 located at the center thereof. Buckled (out-of-plane) microbridges 910 and 920 are formed parallel to microbridge 930. Thermopiles 912 and 922 (the X-Y thermopiles) are located at the center of microbridges 910 and 912, respectively. Buckled microbridges 920 and 930 can be biased with means described herein.

Highly-curved tethers 913 and 923 are coupled to microbridges 910 and 920, respectively. Tethered element 913 has thermopile 915 at its distal end and tethered element 923 has thermopile 925 at its distal end. Thermopiles 915 and 925 are the Z thermopiles. The accelerometer of FIG. 9 enables sensing by resolving acceleration through the analysis of thermal profile of a selected working fluid. The accelerometer is advantageous over the conventional sensors. First, no post-release step is required to achieve the three-dimensional architecture. Instead, device height is created by exploiting the residual stresses in the films that cause buckling in the microbridge element. Second, the adoption of tethers, allows placement of the Z-thermopiles in a region above and closely aligned with the heater, which results in high vertical (Z axis) sensitivity when symmetrical (e.g., rectangular) cavity designs are adopted. Simultaneously, the buckled microbridges allow placing the X-Y thermopiles in high lateral (X-Y axis) sensitivity regions, which are typically located above the heater place when symmetrical cavity designs are adopted.

Thermopiles could be placed both above and below the wafer plane, potentially resulting in shorter cavities and hence enhanced miniaturization. Placement of thermopiles below the wafer plane could be achieved through microbridges that buckle "downwards" (i.e., negative Z direction) and into the etched cavity. An example of thermopile placement for both the X-Y and the Z thermopiles for the 3D platform is shown in FIG. 9B.

Figures 10A, 10B:
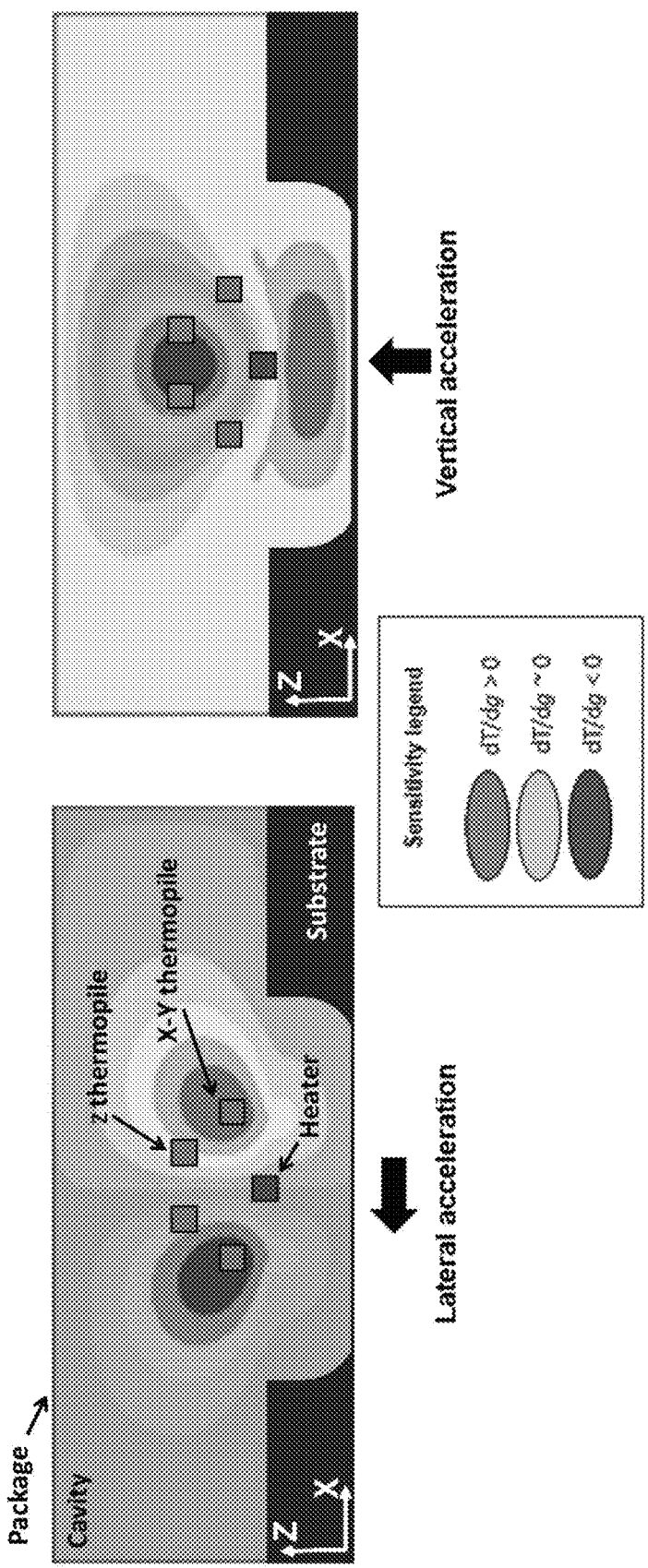
FIGS. 10A and 10B respectively show the lateral and vertical sensitivity plots for an exemplary device with a rectangular cavity design.

As stated, the proposed architecture enables positioning the thermopiles in high sensitivity regions. FIGS. 10A and 10B respectively show the lateral and vertical sensitivity plots for an exemplary device with a rectangular cavity design. It can be readily seen that using the tethered design of FIG. 9A allows placement of all thermopiles in high sensitivity regions of the exemplary device of FIG. 10.

Referring once again to the schematic representation of the "buckled microbridge and tethered architecture of FIG. 8, an analytical design principles will be now be discussed. The geometrical parameter of FIG. 8 are as follows: $L_m$ and $W_m$ denote length and width of microbridge 810, respectively; $L_{te}$ and $W_{te}$ denote the length and width of the connecting bridges, respectively; d is the distance between the root of the main microbridge and the tether's attachment point; and $W_{cb}$ and $L_{cb}$ are, respectively, the length and width of the connection point of the tethers.

In one implementation, the films' thickness as well as the available materials were set by the CMOS fabrication process and the bulk etch sequence (isotropic plasma etch) to 3.3 μm and to the materials of Table 1, respectively. A dielectric/Intra-layer dielectric (ILD)/oxide multilayer film was selected for both the main microbridge and for the tethers, as this material showed the largest gradient stress ($\sigma_{grad}$=−42.1 MPa) as well as large mean stress ($\sigma_{mean}$=−107.8 MPa). The data of Table I exhibits a large (close to clamped) boundary effective (non-dimensional) stiffness value (K~0.92) for the CMOS process.

TABLE 1

Residual Stress And Boundary Flexibility

| Beam Composition | E [GPa] | h [μm] | $\sigma_{mean}$ [MPa] | $\sigma_{grad}$ [MPa] | K |
|---|---|---|---|---|---|
| Polysilicon/Dieletric bilayer | 169 | 2.91 | −107.8 ± 10.8 | 40.1 ± 3.6 | 0.90 ± 0.03 |
| Dielectric bilayer/ILD/Oxide | 176 | 2.90 | −91.5 ± 8.7 | 42.1 ± 3.7 | 0.92 ± 0.03 |
| Al/Oxide/Dieletric bilayer | 171 | 2.90 | −50.6 ± 4.1 | −24.5 ± 2.3 | 0.90 ± 0.04 |

Residual stress knowledge was combined with analytical load deflection curves (see FIG. 11A) to determine the length ($L_m$) and width ($W_m$) values required to ensure buckling of the microbridge at release. The microbridge length and width were respectively set to 400 μm and 40 μm. For this configuration a post-release center deflection of approximately 3.89 μm was predicted.

Figure 11A:
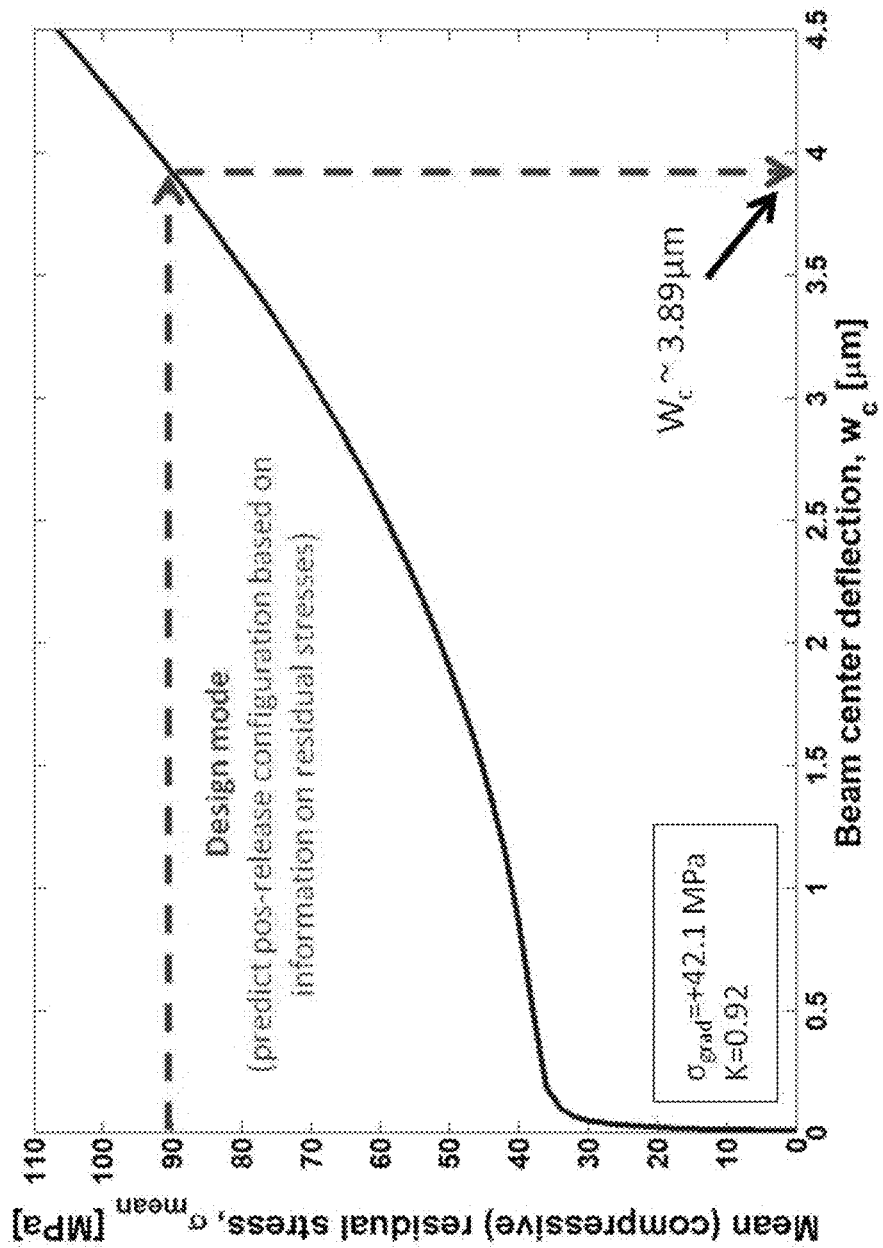
FIGS. 11A-11C show the analytical design parameters for an exemplary buckled microbridge and tether architecture.
Figure 11B:
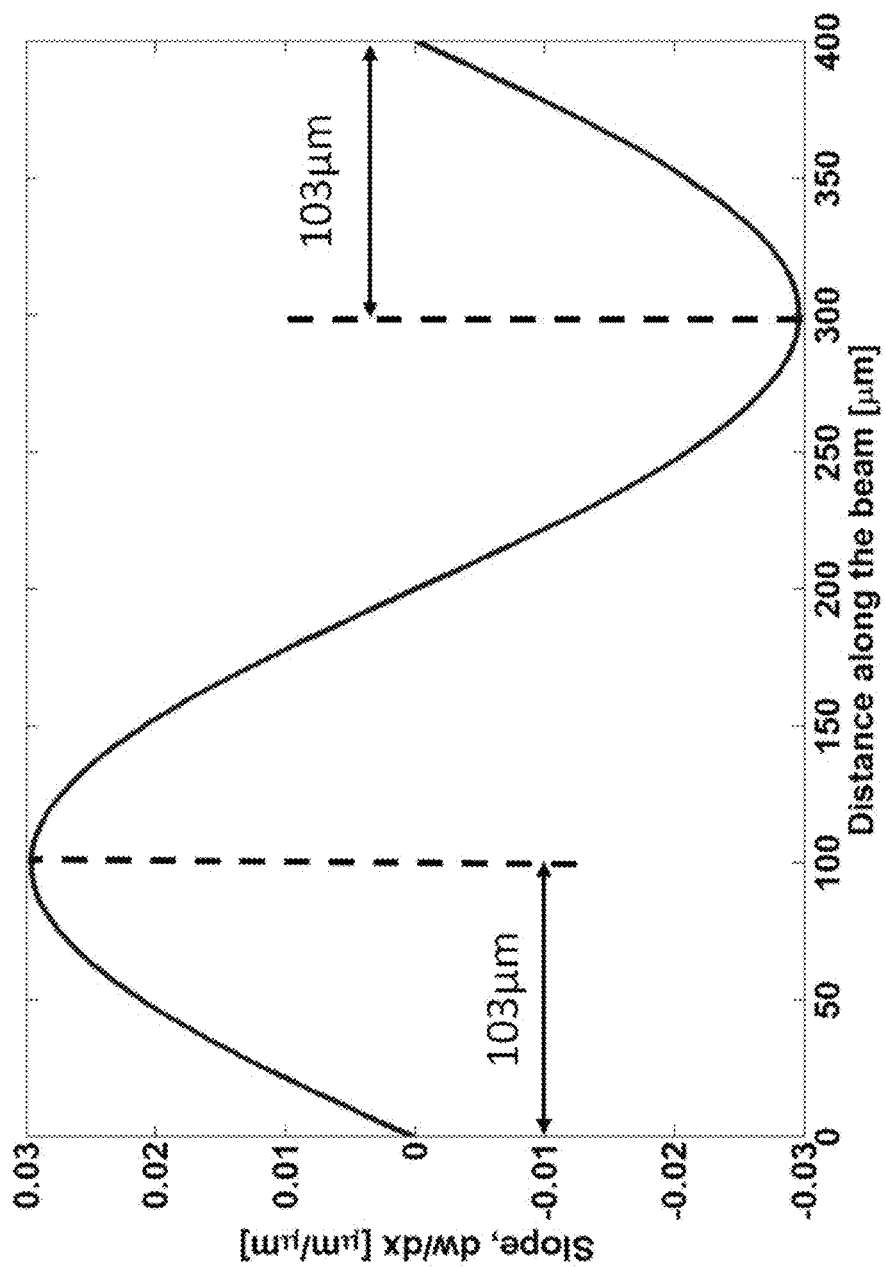
Figure 11C:
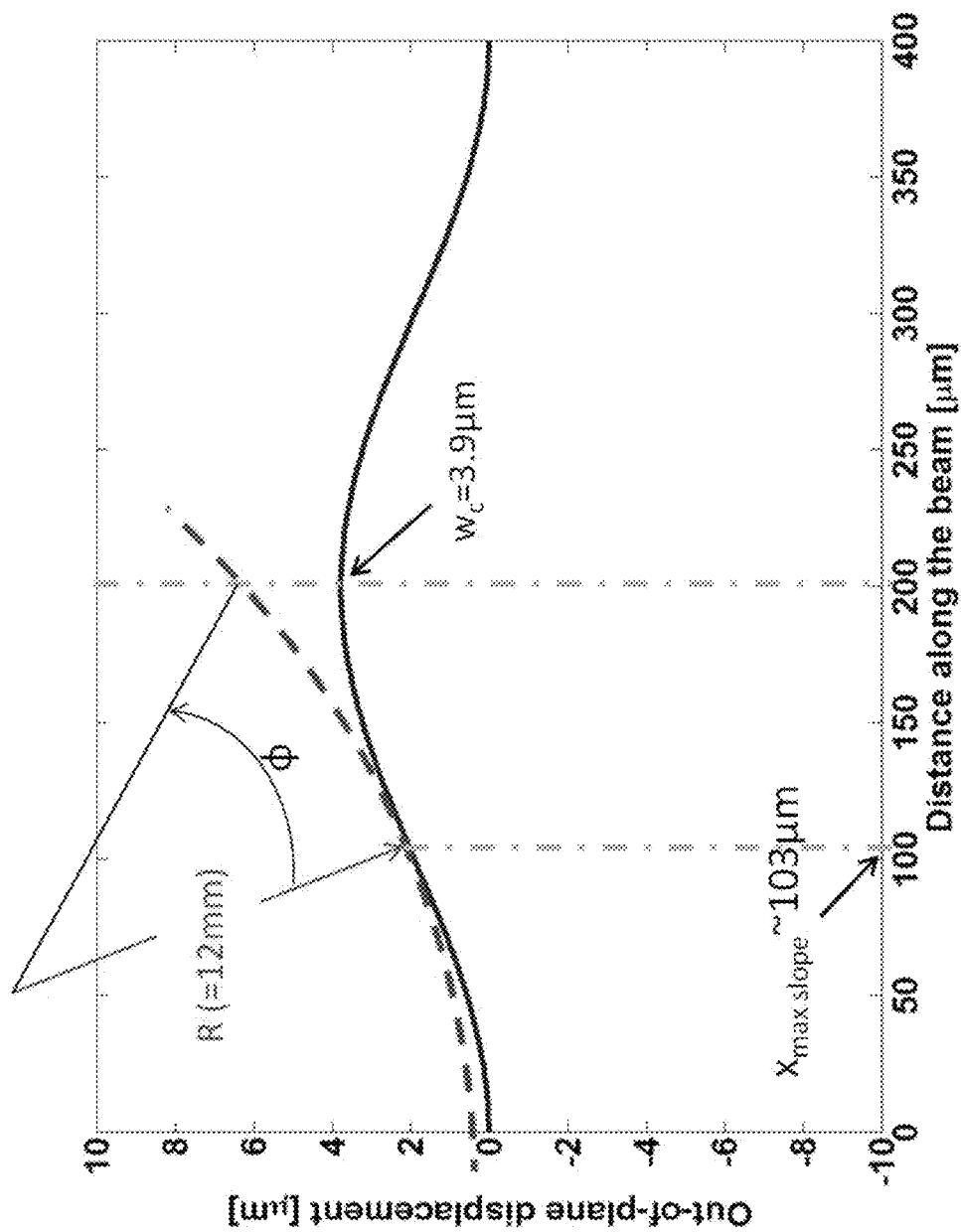

The analytical predictions for post-release microbridge slope (i.e., the point of maximum slope) are shown in FIG. 11B, where the location of maximum slope is approximately 103 μm away from the microbridge's distal ends. Accordingly, the tethers' attachment point (d) was set to 103 μm (FIG. 11C), as this would yield the maximum height gain. The length of the connecting bridge ($L_{cb}$) was set to 30 μm, as this was the minimum etch opening size allowed by the CMOS process herein. The connecting bridges width ($w_{cb}$) was also set to 30 μm, yielding a square layout for these elements.

Residual stress knowledge was combined with analytical results on the post-release microbridge shape to determine the tether geometry (i.e., $L_{te}$, $W_{te}$) that would position the tether's free extremity above the heater. The relationship for the post-release curvature (R) for the dielectric/ILD/oxide and dielectric/ILD/oxide tethers is governed by:

$$R = \frac{\overline{E} \cdot \overline{h}}{\sigma grad} = 12 \cdot 12 \text{ mm} \quad (2)$$

In Equation 2, E was 176 GPa, h was 3.3 μm and $\sigma_{grad}$ Qa 42.1 MPa. Geometrical consideration for the tethers' under pure bending (FIG. 11C) yielded a tether length ($L_{te}$) of 120 μm. The tethers' width ($W_{te}$) was then set to 20 μm, based on experimental results on cantilevered test elements that showed best repeatability when $L_{te}/W_{te}$<10. Table 2 shows a summary of the geometrical specifications for the buckled microbridge and tethers of this example.

TABLE 2

Geometrical Specification for Device of FIG. 9A (dimensions in μm)

| Main microbridge | | Connecting bridges | | Tethers | | |
|---|---|---|---|---|---|---|
| $L_m$ | $W_m$ | $L_{cb}$ | $w_{cb}$ | $L_{te}$ | $W_{te}$ | d |
| 400 | 40 | 30 | 30 | 120 | 20 | 103 |

Figure 9C:
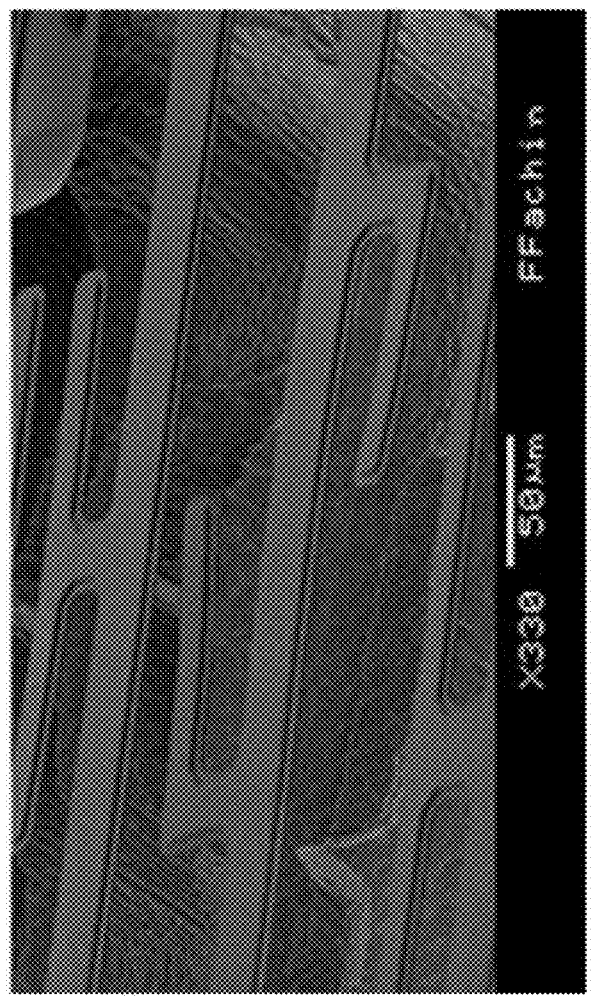
FIG. 9C shows the experimental SEM and profilometric height images of the buckled microbridge and tethers assembly.
Figure 12:
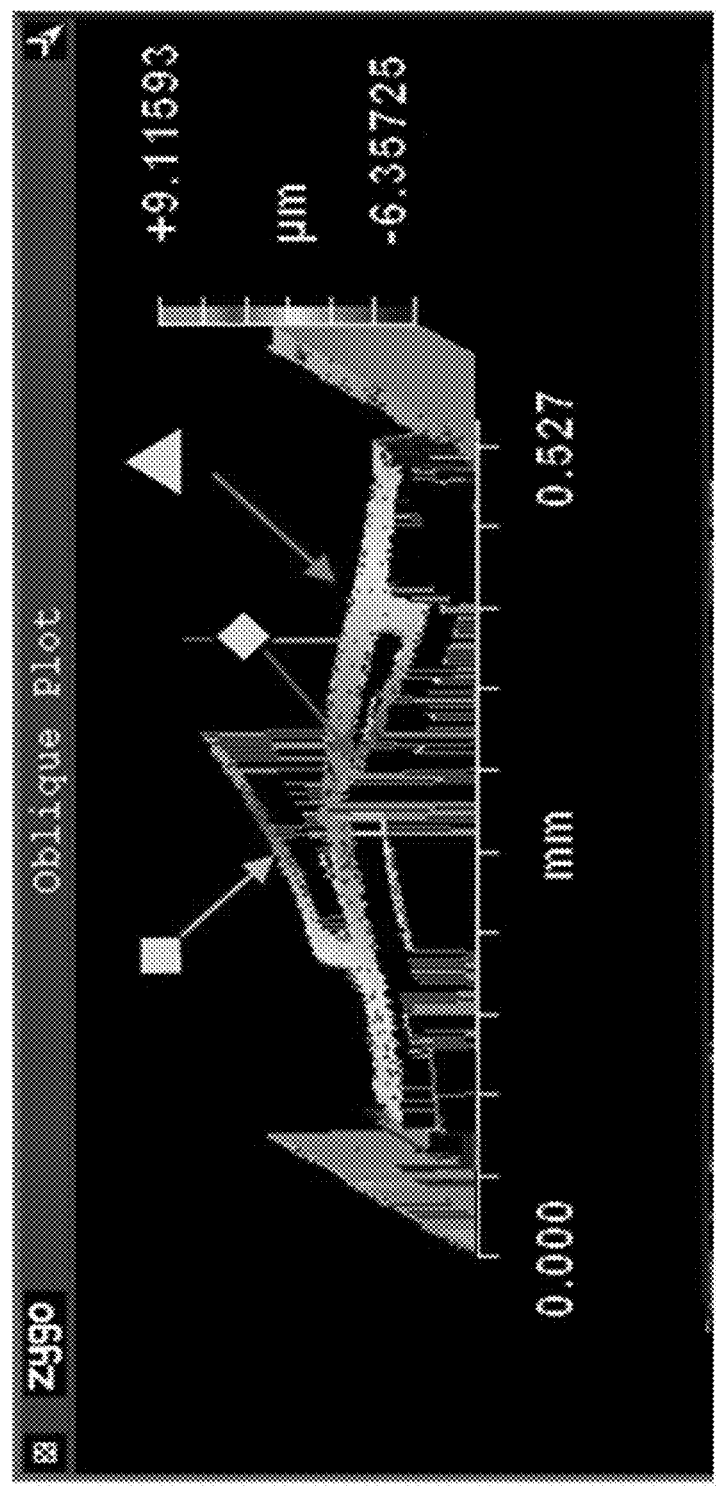
FIG. 12 is the profilometric image (oblique plot) of the device of FIG. 9A.
Figure 13:
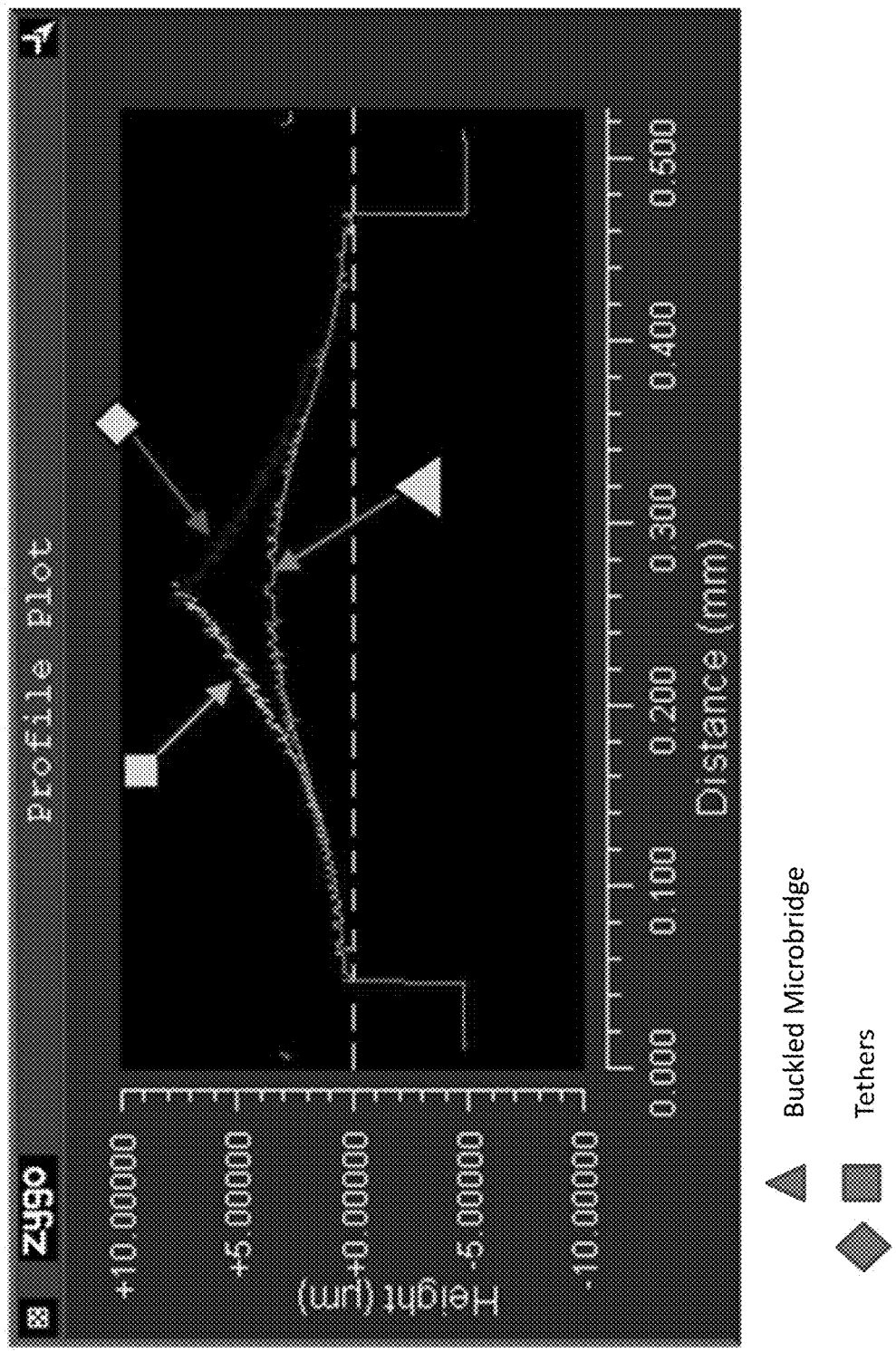
FIG. 13 is the profilometric image (profile plot) of the device of FIG. 9A.

The device of FIG. 9A was fabricated using commercial CMOS foundry processes, with the elements released outside the foundry in a commercial facility through an isotropic plasma etch step. Dicing was performed, followed by profilometry (Zygo) of the as-fabricated elements. FIG. 9C shows the experimental SEM and profilometric height images of the buckled microbridge and tethers assembly. FIG. 12 shows an oblique plot of the final released element. Here, the three-dimensionality of the architecture becomes apparent: the main microbridge is clearly out-of-plane, a result of the large compressive residual stresses in the material, while the tethers extend even further out-of-plane due to gradient induced bending effects. As evident, the final location for the microbridge center and for the tethers' tips are +3.84 μm and +7.59 μm above the wafer plane, respectively. This is consistent with the analytical model's prediction shown in FIG. 11C The alignment between the tether's tips and the microbridge center is further highlighted in FIG. 13 which shows a surface profile plot of the device. These results demonstrate the ability to create 3D elements through buckling of micro-machined elements. As previously discussed, the buckled microbridge and tethers architecture is applicable in, among others, three-axis single heater thermal accelerometers, where the thermopiles could be positioned at the center of the buckled microbridge as well as at the free extremities of the curved tethers.

Additional considerations for such device would include tethers' flexibility and interaction with the working fluid under applied acceleration fields, which could result in significant non-linear response and dynamic sensitivities. Importantly, disclosed principles and embodiments enable designs and apparatus where the sensing elements extend below the wafer plan (i.e., within the etch cavity). Such designs are particularly advantageous for thermal accelerometers as they enable positioning the sensing elements below the heater, and therefore in an additional high sensitivity region for vertical, Z-axis accelerations (See FIG. 9A).

While the principles of the disclosure have been illustrated in relation to the exemplary embodiments shown herein, the principles of the disclosure are not limited thereto and include any modification, variation or permutation thereof.

What is claimed is:

1. A method for causing post-release deformation in a microbridge, the method comprising:
    identifying a film material to be formed as microbridge extending between a first support and a second support;
    forming a first unitary patch on the first support and a second unitary patch on the second support;
    forming a microbridge extending from the first unitary patch to the second unitary patch, the microbridge overlapping a portion of at least one of the first unitary patch or the second unitary patch and such that at least one of the first unitary patch or the second patch unitary exerting external moment to the microbridge; and removing at least one of the first or the second unitary patch.

2. The method of claim 1, wherein the external moment exerting on the microbridge in a direction opposite to the micro-bridge's natural deformation.

3. The method of claim 1, wherein the external moment exerting on the microbridge in a direction opposite to residual stresses formed in the microbridge.

4. The method of claim 1, wherein at least one of the first unitary patch or the second unitary patch forming a compressive control structure causing downward deflection of the microbridge having a positive gradient stress.

5. The method of claim 1, wherein the external moment is a function of the first unitary patch geometry and composition.

6. The method of claim 5, further comprising selecting the first unitary patch and the second unitary patch geometry exerting external moment on the microbridge substantially similar to residual stresses formed in the microbridge.

7. The method of claim 5, further comprising selecting the first unitary patch and the second unitary patch composition exerting external moment to the microbridge substantially identical to residual stresses formed in the microbridge.

8. The method of claim 1, wherein the first unitary patch provides a first residual stress and the second unitary patch provides a second residual stress and wherein the first and the second residual stresses counterbalance a post-release residual stress in the microbridge.

9. The method of claim 1, further comprising selecting the first unitary patch to have a mean residual stress greater than a residual stress of the microbridge.

10. The method of claim 1, further comprising selecting the first unitary patch to have a mean residual stress greater equal or less than a residual stress of the microbridge.

11. The method of claim 1, further comprising selecting the first unitary patch to have a gradient residual stress greater than a gradient stress of the microbridge.

12. The method of claim 1, further comprising selecting the first unitary patch to have a gradient residual stress equal or less than a gradient stress of the microbridge.

13. The method of claim 1, wherein the microbridge defines a dielectric bilayer.

14. The method of claim 1, wherein the film material further comprises multiple film layers.

15. The method of claim 1, wherein the microbridge provides about 1, 5, 10, 50, 100 or 500 times out-of-plane projection with respect to the film thickness.

16. A method for causing post-release deformation in a microbridge, the method comprising:
forming a microbridge between the first support and the second support over a substrate;
forming a first unitary post over the first support, the first unitary post extending above a second surface of the microbridge;
removing the substrate;
wherein the first unitary post is aligned with a first edge of the microbridge at a first alignment point and wherein the first unitary post and the microbridge do not overlap; and
wherein the first unitary post is aligned for exerting external moment to the microbridge.

17. The method of claim 16, further comprising forming a second unitary post over the second support, the second unitary post extending above the second surface of the microbridge and the second unitary post aligning with the second edge of the microbridge at a second alignment point.

18. The method of claim 17, wherein the first unitary post and the second post bias the microbridge in a direction opposite the microbridge's natural deformation.

19. The method of claim 17, wherein the first unitary post and the second post induce a down-ward moment on the microbridge at the first alignment point and the second alignment point, respectively.

20. The method of claim 19, wherein the downward moment biases a post-release deformation at the microbridge.

21. The method of claim 17, wherein the microbridge does not overlap the second unitary post.

22. The method of claim 17, further comprising forming at least one of the first or the second unitary post as a trapezoid.

23. The method of claim 16, wherein the microbridge defines a multilayer film.

24. The method of claim 16, further comprising removing the first unitary post.

25. A MEMS structure having an out-of-plane surface, comprising:
a substrate supporting a microbridge, the microbridge extending over a cavity in the substrate;
a first unitary post formed over the first support, the first unitary post extending above a surface of the microbridge; and
a second unitary post formed over the second support, the second unitary post extending above the surface of the microbridge;
wherein the first unitary post abuts a first edge of the microbridge at a first alignment point and the second unitary post abuts a second edge of the microbridge at a second alignment point and wherein the microbridge does not overlap the first or the second unitary posts.

26. The method of claim 25, wherein the first unitary post and the second post bias the microbridge in a direction opposite the microbridge's natural deformation.

27. The method of claim 25, wherein the first unitary post and the second post induce a down-ward moment on the microbridge at the first alignment point and the second alignment point, respectively.

28. The method of claim 25, wherein the downward moment biases a post-release deformation at the microbridge.

29. The method of claim 25, wherein the microbridge defines a multilayer film.

* * * * *